United States Patent
Hashizume et al.

(10) Patent No.: US 8,501,025 B2
(45) Date of Patent: Aug. 6, 2013

(54) SUBSTRATE TREATMENT APPARATUS AND SUBSTRATE TREATMENT METHOD

(75) Inventors: Akio Hashizume, Kyoto (JP); Yuya Akanishi, Kyoto (JP); Kenji Kawaguchi, Kyoto (JP); Manabu Yamamoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 127 days.

(21) Appl. No.: 13/045,024

(22) Filed: Mar. 10, 2011

(65) Prior Publication Data

US 2011/0240601 A1    Oct. 6, 2011

(30) Foreign Application Priority Data

Mar. 31, 2010   (JP) .................................. 2010-082247
Mar. 31, 2010   (JP) .................................. 2010-082248

(51) Int. Cl.
    *C03C 15/00*          (2006.01)

(52) U.S. Cl.
    USPC .............. 216/83; 118/52; 118/319; 118/323; 118/600; 118/602; 134/153; 134/902

(58) Field of Classification Search
    USPC ..................... 216/83; 118/52, 319, 323, 600, 118/602; 134/153, 902
See application file for complete search history.

(56) References Cited

U.S. PATENT DOCUMENTS

| | | | |
|---|---|---|---|
| 7,422,641 B2 * | 9/2008 | Nakajima et al. | 134/26 |
| 2007/0204562 A1 | 9/2007 | Till et al. | |
| 2007/0283983 A1 | 12/2007 | Park et al. | |
| 2008/0014358 A1 * | 1/2008 | Koo et al. | 427/372.2 |

FOREIGN PATENT DOCUMENTS

| | | |
|---|---|---|
| CN | 101024477 | 8/2007 |
| CN | 101090061 | 12/2007 |
| JP | 6-120133 | 4/1994 |
| JP | 6-333899 | 12/1994 |
| JP | 10-12585 | 1/1998 |
| JP | 10-74686 | 3/1998 |
| JP | 2971681 B2 | 8/1999 |
| JP | 2001-223195 | 8/2001 |
| JP | 2002-131653 | 5/2002 |
| JP | 2002-184739 | 6/2002 |
| JP | 2003-174006 | 6/2003 |
| JP | 2004-111592 | 4/2004 |
| JP | 2004-158482 | 6/2004 |
| JP | 2004-193568 | 7/2004 |
| JP | 2004-247752 | 9/2004 |
| JP | 2009-141281 | 6/2009 |
| JP | 2009-267101 | 11/2009 |
| KR | 10-2004-0047602 | 6/2004 |
| WO | 2006/049302 | 5/2006 |

* cited by examiner

*Primary Examiner* — Nadine Norton
*Assistant Examiner* — Maki Angadi
(74) *Attorney, Agent, or Firm* — Ostrolenk Faber LLP

(57) ABSTRACT

A substrate treatment apparatus is provided, which includes: a seal chamber including a chamber body having an opening, a lid member provided rotatably with respect to the chamber body and configured to close the opening, and a first liquid seal structure which liquid-seals between the lid member and the chamber body, the seal chamber having an internal space sealed from outside; a lid member rotating unit which rotates the lid member; a substrate holding/rotating unit which holds and rotates a substrate in the internal space of the seal chamber; and a treatment liquid supplying unit which supplies a treatment liquid to the substrate rotated by the substrate holding/rotating unit.

3 Claims, 12 Drawing Sheets

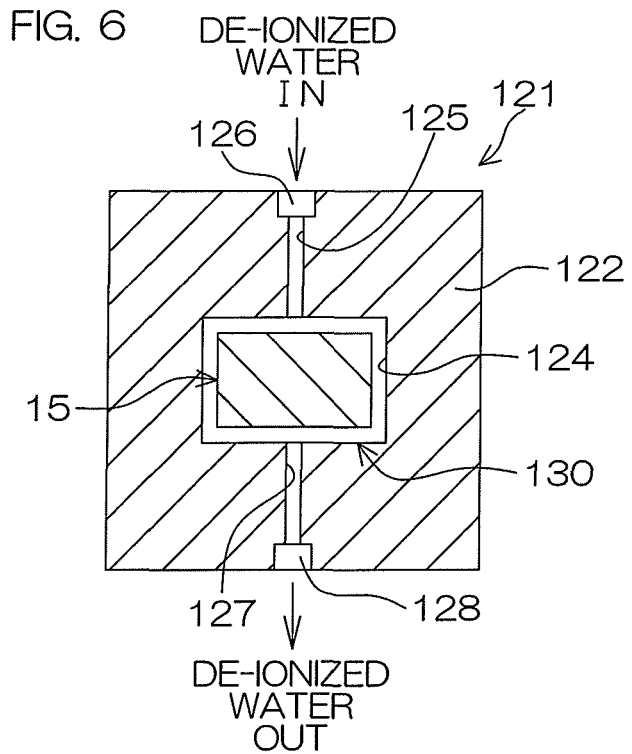
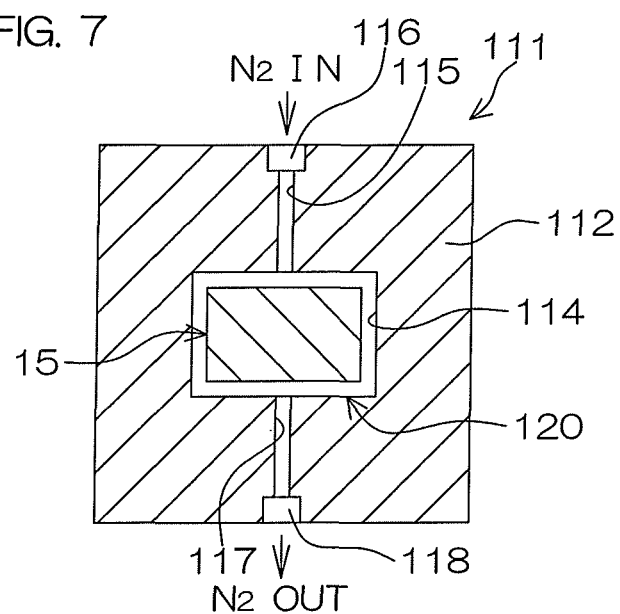

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for treating a substrate. Examples of the substrate to be treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, and substrates for solar cells.

2. Description of Related Art

In a semiconductor device production process, for example, a substrate such as a semiconductor wafer or a glass substrate for a liquid crystal display panel is treated with a chemical agent. For the treatment with the chemical agent, a substrate treatment apparatus of a single substrate treatment type is often used, which is adapted to treat a single substrate at a time. The substrate treatment apparatus of the single substrate treatment type typically includes a treatment chamber having a partition wall defining an internal space thereof, a spin chuck provided in the treatment chamber for generally horizontally holding and rotating the substrate, a chemical agent nozzle for supplying the chemical agent to the substrate, and a nozzle moving mechanism which moves the chemical agent nozzle.

In a polymer removing process for removing a polymer from a front surface of the substrate, for example, a chemical agent having an oxygen concentration sufficiently reduced for prevention of oxidation of wirings formed on the substrate is spouted from the chemical agent nozzle (see Japanese Unexamined Patent Publication (KOKAI) No. 2004-158482). In this case, the atmosphere in the treatment chamber is desirably controlled to be maintained at a lower oxygen concentration level so as to prevent oxygen from dissolving in the treatment liquid spouted from the chemical agent nozzle.

However, the internal space of the treatment chamber is relatively spacious with various components accommodated therein. Therefore, it is difficult to sufficiently control the atmosphere in the treatment chamber.

SUMMARY OF THE INVENTION

The inventors of the present invention have conducted studies to achieve the sufficient control of the atmosphere in the treatment chamber by sealing the internal space of the treatment chamber and reducing the internal space.

However, it seems to be impossible to effectively reduce the internal space, because various components are disposed together in the treatment chamber. Particularly, where the apparatus includes a shield plate to be disposed adjacent the front surface of the substrate and rotatable with the front surface of the substrate covered thereby, the treatment chamber should be configured so as to surround the spin chuck and the shield plate. This makes it impossible to effectively reduce the volume of the internal space of the treatment chamber, making it difficult to achieve the sufficient control of the atmosphere in the treatment chamber.

Depending on the type of the treatment to be performed on the substrate, it is desirable to employ a movable nozzle to perform the treatment by spouting a treatment liquid (a chemical agent or a rinse liquid) from the nozzle while moving the nozzle. However, the movable nozzle requires a nozzle moving mechanism for moving the nozzle, and the nozzle moving mechanism is also disposed in the treatment chamber. Therefore, the internal space of the treatment chamber is inevitably increased in order to achieve the treatment with the use of the movable nozzle, resulting in insufficient control of the atmosphere in the internal space.

It is therefore an object of the present invention to provide a substrate treatment apparatus and a substrate treatment method which ensure that a substrate can be properly treated in a seal chamber configured such that the volume of its internal space can be reduced.

It is another object of the present invention to provide a substrate treatment apparatus which is adapted to treat a substrate while moving a nozzle, and includes a seal chamber having a reduced internal space.

According to a first aspect of the present invention, there is provided a substrate treatment apparatus, which includes: a seal chamber including a chamber body having an opening, a lid member provided rotatably with respect to the chamber body and configured to close the opening, and a first liquid seal structure which liquid-seals between the lid member and the chamber body, the seal chamber having an internal space sealed from outside; a lid member rotating unit which rotates the lid member; a substrate holding/rotating unit which holds and rotates a substrate in the internal space of the seal chamber; and a treatment liquid supplying unit which supplies a treatment liquid to the substrate rotated by the substrate holding/rotating unit.

With this arrangement, the treatment liquid is supplied to the substrate in the internal space of the seal chamber, while the substrate is rotated by the substrate holding/rotating unit. Since the lid member is rotatable, the lid member and the substrate are rotated relative to each other or in synchronism. This makes it possible to rotate the lid member for treatment of the substrate, whereby the substrate can be advantageously treated.

The first liquid seal structure seals between the lid member and the chamber body. Therefore, the internal space of the seal chamber can be maintained in a sealed state even during the rotation of the lid member. The liquid seal structure, which is employed as a seal structure, is substantially free from emission of dust and reduction in sealability as compared with a case in which a contact seal structure is employed. Thus, the seal between the lid member and the chamber body can be properly maintained for a longer period of time.

In the present invention, the sealed space is defined by the chamber body, the rotatable lid member and the first liquid seal structure sealing between the chamber body and the lid member. The rotatable lid member can also function as a shield plate, obviating the need for separately providing the shield plate in the sealed space. This makes it possible to reduce the volume of the sealed space, permitting sufficient control of the internal atmosphere. For example, the internal space can be controlled to be maintained in a lower oxygen concentration atmosphere.

The substrate treatment apparatus preferably further includes a first moving unit which moves at least one of the substrate holding/rotating unit and the seal chamber to relatively move the substrate held by the substrate holding/rotating unit and the lid member toward and away from each other.

With this arrangement, a positional relationship between the substrate and the lid member can be changed. Therefore, the positional relationship between the substrate and the lid member can be changed for a liquid treatment process in which the substrate is treated with the treatment liquid supplied from the treatment liquid supplying unit and for other processes. Thus, the liquid treatment process and the other processes can be each performed under optimum conditions.

The first moving unit is preferably configured so as to move at least one of the substrate holding/rotating unit and the seal chamber to change a position of the substrate holding/rotating unit defined relative to the seal chamber between a liquid treatment position at which the liquid treatment process is performed to treat the substrate with the treatment liquid supplied from the treatment liquid supplying unit and a chamber cleaning position at which the substrate holding/rotating unit is located closer to the lid member than at the liquid treatment position to clean an inside of the seal chamber.

With this arrangement, the inside of the seal chamber is cleaned with the substrate holding/rotating unit being located relative to the seal chamber at the chamber cleaning position different from the liquid treatment position. The substrate holding/rotating unit is located closer to the lid member at the chamber cleaning position than at the liquid treatment position. During the liquid treatment process, the treatment liquid scatters around from the substrate to adhere to a region of an interior wall of the seal chamber opposed to the periphery of the substrate held by the substrate holding/rotating unit located at the liquid treatment position. When the seal chamber is cleaned, therefore, the substrate holding/rotating unit is located closer to the lid member than at the liquid treatment position. Thus, the interior wall region opposed to the periphery of the substrate held by the substrate holding/rotating unit located at the liquid treatment position, for example, is located at a lower position than the substrate holding/rotating unit located at the chamber cleaning position. Therefore, the treatment liquid removed from the interior wall of the seal chamber (the treatment liquid adhering to the interior wall of the seal chamber during the liquid treatment process) is substantially prevented from splashing over and adhering to the substrate holding/rotating unit during the cleaning of the interior wall of the seal chamber. This suppresses contamination of the substrate holding/rotating unit and hence contamination of the substrate held by the substrate holding/rotating unit.

Further, the first moving unit is preferably configured so as to move at least one of the substrate holding/rotating unit and the seal chamber to change the position of the substrate holding/rotating unit defined relative to the seal chamber to a drying position at which the substrate holding/rotating unit is located closer to the lid member than at the chamber cleaning position.

With this arrangement, a drying process is performed on the substrate with the substrate holding/rotating unit being located at the drying position at which the substrate is located closer to the lid member than at the chamber cleaning position. Therefore, a minute space can be defined between the substrate and the lid member during the drying process. Thus, the drying process can be performed on the substrate with the space between the substrate and the lid member being shielded from the other atmosphere. This permits precise control of the atmosphere adjacent to the front surface of the substrate, and suppresses adhesion of foreign matter to the front surface of the substrate.

Further, the first moving unit is preferably configured so as to move at least one of the substrate holding/rotating unit and the seal chamber to change the position of the substrate holding/rotating unit defined relative to the seal chamber between the liquid treatment position at which the liquid treatment process is performed to treat the substrate with the treatment liquid supplied from the treatment liquid supplying unit and a drying position at which the substrate is located closer to the lid member than at the liquid treatment position to perform the drying process on the substrate.

With this arrangement, the drying process is performed on the substrate with the substrate holding/rotating unit being located relative to the seal chamber at the drying position different from the liquid treatment position. This makes it possible to properly perform the drying process on the substrate while suppressing the influence of the treatment liquid.

When the drying process is performed on the substrate, the substrate holding/rotating unit is located at the drying position at which the substrate is located closer to the lid member than at the liquid treatment position. Therefore, a minute space can be defined between the substrate and the lid member during the drying process. Thus, the drying process can be performed on the substrate with the space between the substrate and the lid member being shielded from the ambient atmosphere. This makes it possible to advantageously perform the drying process while precisely controlling the atmosphere adjacent to the front surface of the substrate, and suppresses adhesion of foreign matter to the front surface of the substrate during the drying process.

The substrate treatment apparatus may further include a cleaning liquid spouting unit which spouts a cleaning liquid toward the lid member. With such an arrangement, the treatment liquid generally scatters from the major surface of the substrate to adhere to the lid member and the chamber body. If the treatment liquid is dried to be crystallized on a surface of the lid member or on an interior wall of the chamber body, the substrate may be contaminated. This problem is particularly noticeable when the treatment liquid is a chemical agent.

In this case, the substrate treatment apparatus preferably further includes a chamber cleaning control unit which controls the lid member rotating unit to rotate the lid member at a predetermined lid cleaning rotation speed and controls the cleaning liquid spouting unit to spout the cleaning liquid from the cleaning liquid spouting unit.

With this arrangement, the treatment liquid adhering onto the lid member can be washed away by spouting the cleaning liquid toward the lid member from the cleaning liquid spouting unit while rotating the lid member. The cleaning liquid supplied to the lid member receives a centrifugal force generated by the rotation of the lid member to move toward a peripheral portion of the lid member, and is supplied to the interior wall of the chamber body. Therefore, the treatment liquid adhering to the interior wall of the chamber body can be washed away. Thus, the entire interior wall of the seal chamber can be cleaned. Even during the rotation of the lid member, the inside of the seal chamber can be maintained in the sealed state by the function of the first liquid seal structure. Since the interior wall of the seal chamber defining a smaller internal space can be kept clean, the substrate can be properly treated in the internal space.

The lid member preferably has a substrate opposing surface to be opposed to an entire major surface of the substrate held by the substrate holding/rotating unit, and the substrate treatment apparatus preferably further includes a drying control unit which controls the substrate holding/rotating unit and the lid member rotating unit to rotate the substrate held by the substrate holding/rotating unit and the lid member at a predetermined drying rotation speed in a same direction.

With this arrangement, a pneumatic stream is stably generated between the major surface of the substrate and the substrate opposing surface of the lid member by rotating the lid member and the substrate in synchronism. Thus, the drying process can be advantageously performed on the substrate.

The substrate holding/rotating unit may have a portion exposed outside the seal chamber. In this case, the substrate treatment apparatus preferably further includes a second moving unit which moves the substrate holding/rotating unit and the seal chamber relative to each other, and a second liquid seal structure which liquid-seals between the substrate holding/rotating unit and the seal chamber.

With this arrangement, the substrate holding/rotating unit and the seal chamber are moved relative to each other. The second liquid seal structure liquid-seals between the substrate holding/rotating unit and the seal chamber irrespective of the positional relationship between the substrate holding/rotating unit and the seal chamber. Therefore, the internal space of the seal chamber can be maintained in the sealed state irrespective of the positions of the substrate holding/rotating unit and the seal chamber.

The first liquid seal structure preferably has a seal channel provided in the chamber body as extending along the entire periphery of the opening for retaining a seal liquid, and the lid member preferably has a seal ring inserted in the seal channel and immersed in the seal liquid. The substrate treatment apparatus preferably further includes a seal liquid supplying unit which supplies the seal liquid to the seal channel, and the seal liquid is preferably always supplied to the seal channel from the seal liquid supplying unit during the an operation of the substrate treatment apparatus.

With this arrangement, the seal channel is provided in the chamber body as extending along the entire periphery of the opening. The seal ring of the lid member is inserted in the seal channel to be immersed in the seal liquid (e.g., de-ionized water) retained in the seal channel. Thus, the seal liquid seals between the seal ring and the seal channel. The seal is maintained by the first liquid seal structure even during the rotation of the lid member.

Since the seal liquid is always supplied to the seal channel, there is no possibility that the seal liquid is depleted. Thus, the seal between the lid member and the chamber body can be maintained for a longer period of time. Further, the seal liquid in the seal channel can be constantly replaced. This suppresses accumulation of contaminants in the seal liquid in the seal channel.

The substrate treatment apparatus may further include an inert gas supplying unit which supplies an inert gas into the seal chamber.

A substrate treatment method according to the present invention includes: a seal chamber preparing step of preparing a seal chamber including a chamber body having an opening, a lid member provided rotatably with respect to the chamber body and configured to close the opening, and a first liquid seal structure which liquid-seals between the lid member and the chamber body, the seal chamber having an internal space sealed from outside; a substrate rotating step of placing a substrate in the internal space of the seal chamber and rotating the substrate in the internal space; and a treatment liquid supplying step of supplying a treatment liquid to the substrate in the internal space of the chamber, the treatment liquid supplying step being performed simultaneously with the substrate rotating step.

According to the inventive method, the treatment liquid is supplied to the substrate in the internal space of the seal chamber, while the substrate is rotated by a substrate holding/rotating unit. Since the lid member is rotatable, the lid member and the substrate are rotated relative to each other or in synchronism. This makes it possible to rotate the lid member for treatment of the substrate, whereby the substrate can be advantageously treated.

The first liquid seal structure seals between the lid member and the chamber body. Therefore, the internal space of the seal chamber can be maintained in a sealed state even during the rotation of the lid member. The liquid seal structure, which is employed as a seal structure, is substantially free from emission of dust and reduction in sealability as compared with a case in which a contact seal structure is employed. Thus, the seal between the lid member and the chamber body can be properly maintained for a longer period of time.

In the present invention, the sealed space is defined by the chamber body, the rotatable lid member and the first liquid seal structure sealing between the chamber body and the lid member. The rotatable lid member can also function as a shield plate, obviating the need for separately providing the shield plate in the sealed space. This makes it possible to reduce the volume of the sealed space, permitting sufficient control of the internal atmosphere. For example, the internal space can be controlled to be maintained in a lower oxygen concentration atmosphere.

The method preferably further includes: a first locating step of locating the substrate and the lid member in a lid cleaning positional relationship such that the substrate is located closer to the lid member than in the treatment liquid supplying step; and a lid member cleaning step of rotating the lid member at a predetermined lid cleaning rotation speed and spouting a cleaning liquid toward the lid member from a cleaning liquid spouting unit with the substrate and the lid member being located in the lid cleaning positional relationship.

In general, the treatment liquid scatters from the major surface of the substrate to adhere to the lid member and the chamber body. If the treatment liquid is dried to be crystallized on a surface of the lid member or on an interior wall of the chamber body, the substrate may be contaminated. This problem is particularly noticeable when the treatment liquid is a chemical agent.

According to the inventive method, the treatment liquid adhering to the lid member can be washed away by spouting the cleaning liquid toward the lid member from the cleaning liquid spouting unit while rotating the lid member. The cleaning liquid supplied to the lid member receives a centrifugal force generated by the rotation of the lid member to move toward a peripheral portion of the lid member, and is supplied to the interior wall of the chamber body. Therefore, the treatment liquid adhering to the interior wall of the chamber body can be washed away. Thus, the entire interior wall of the seal chamber can be cleaned. Even during the rotation of the lid member, the inside of the seal chamber can be maintained in the sealed state by the function of the first liquid seal structure. Since the interior wall of the seal chamber defining a smaller internal space can be kept clean, the substrate can be properly treated in the internal space.

Further, the cleaning of the lid member, i.e., the cleaning of the inside of the seal chamber, is achieved with the substrate holding/rotating unit being located relative to the seal chamber at a lid cleaning position different from a liquid treatment position. The substrate holding/rotating unit is located closer to the lid member at the lid cleaning position than at the liquid treatment position. In a liquid treatment process, the treatment liquid generally scatters around from the substrate to adhere to a region of an interior wall of the seal chamber opposed to the periphery of the substrate held by the substrate holding/rotating unit located at the liquid treatment position. When the seal chamber is cleaned, therefore, the substrate holding/rotating unit is located closer to the lid member than at the liquid treatment position. Thus, the interior wall region opposed to the periphery of the substrate held by the substrate holding/rotating unit located at the liquid treatment position, for example, is located at a lower position than the substrate holding/rotating unit located at the lid cleaning position. Therefore, the treatment liquid removed from the interior wall of the seal chamber (the treatment liquid adhering to the interior wall of the seal chamber during the liquid treatment process) is substantially prevented from splashing over and adhering to the substrate holding/rotating unit during the cleaning of the interior wall of the seal chamber. This suppresses contamination of the substrate holding/rotating unit and hence contamination of the substrate held by the substrate holding/rotating unit.

The method preferably further includes a second locating step of locating the substrate and the lid member in a drying positional relationship such that the substrate is located closer to the lid member than in the lid member cleaning step; and a drying step of rotating the lid member and the substrate at a predetermined drying rotation speed with the substrate and the lid member being located in the drying positional relationship.

According to this method, the drying step is performed with the substrate and the lid member being located in the drying positional relationship such that the substrate is located closer to the lid member than in the lid member cleaning step. Therefore, a minute space can be defined between the substrate and the lid member during the drying step. Thus, the substrate can be dried with the space between the substrate and the lid member being shielded from the ambient atmosphere. This makes it possible to properly dry the substrate while permitting precise control of the atmosphere adjacent to the front surface of the substrate, and suppresses adhesion of foreign matter to the front surface of the substrate.

In this case, a pneumatic stream is stably generated between the major surface of the substrate and a substrate opposing surface of the lid member by rotating the lid member and the substrate in synchronism. Thus, the drying step can be advantageously performed.

According to a second aspect of the present invention, there is provided a substrate treatment apparatus, which includes: a seal chamber having a partition wall defining a sealed internal space; a substrate holding/rotating unit which holds and rotates a substrate in the internal space of the seal chamber; a nozzle which spouts a treatment liquid toward a major surface of the substrate held by the substrate holding/rotating unit in the internal space of the seal chamber; a nozzle arm which supports the nozzle and extends from inside to outside of the seal chamber through a passage hole provided in the partition wall of the seal chamber; and a driving unit disposed outside the seal chamber to move the nozzle arm over the major surface of the substrate held by the substrate holding/rotating unit.

With this arrangement, the nozzle arm supporting the nozzle extends from the inside to the outside of the seal chamber through the passage hole of the partition wall. The driving unit for driving the nozzle arm is disposed outside the seal chamber. The driving unit inputs its driving force to a part of the nozzle arm exposed from the seal chamber to move the nozzle arm. The nozzle can be moved in the seal chamber by the driving force thus inputted from the driving unit disposed outside the seal chamber. Since the driving unit is disposed outside the seal chamber, the internal space of the seal chamber can be reduced.

The nozzle arm is preferably configured to extend along a predetermined reference line generally parallel to the major surface of the substrate held by the substrate holding/rotating unit, and the passage hole is preferably present on the reference line in the partition wall of the seal chamber. Further, the driving unit is preferably adapted to move the nozzle arm along the reference line.

With this arrangement, the nozzle arm configured to extend along the reference line is moved along the reference line. That is, the nozzle arm passes through only a part of a plane defined perpendicularly to the reference line during the movement. Therefore, the size of the passage hole provided in the partition wall can be minimized. Thus, the internal space of the seal chamber can be easily maintained in the sealed state.

The reference line may be linear, and the driving unit may include a linear driving unit which linearly moves the nozzle arm along the reference line.

In this case, the linear driving unit may include a drive arm connected to the nozzle arm at a variable connection position, and a pivot driving unit which pivots the drive arm about a predetermined pivot axis perpendicular to the reference line.

Alternatively, the reference line may be arcuate, and the driving unit may include an arcuate driving unit which arcuately moves the nozzle arm along the reference line.

The substrate treatment apparatus may further include a seal structure which seals between the nozzle arm and the partition wall of the seal chamber. In this case, the internal space of the seal chamber can be reliably shielded from the outside of the seal chamber by the seal structure regardless of the movement of the nozzle arm.

The seal structure is preferably used in combination with the linear driving unit. With the combinational use of the seal structure and the linear driving unit, the size of the passage hole can be minimized, thereby reducing the size of the seal structure.

The seal structure may include a liquid seal structure which liquid-seals between the nozzle arm and the partition wall of the seal chamber, and a gas seal structure which gas-seals between the nozzle arm and the partition wall of the seal chamber.

With this arrangement, the liquid seal structure and the gas seal structure cooperatively seal between the nozzle arm and the partition wall.

During the treatment of the substrate, for example, the treatment liquid is spouted from the treatment liquid nozzle toward the major surface of the substrate being rotated by the substrate holding/rotating unit. However, the treatment liquid is liable to scatter around the substrate to adhere to an outer surface of the nozzle arm during the substrate treatment. The treatment liquid is liable to be dried and crystallized on the outer surface of the nozzle arm, and the dried treatment liquid component is disintegrated into particles, which will contaminate the substrate being rotated by the substrate holding/rotating unit.

However, the liquid seal structure seals between the nozzle arm and the partition wall with a seal liquid, so that the seal liquid contacts the outer surface of the nozzle arm. Therefore, the contaminant adhering to the outer surface of the nozzle arm is washed away with the seal liquid. That is, the outer surface of the nozzle arm is cleaned with the seal liquid.

Further, the gas seal structure seals between the nozzle arm and the partition wall with a seal gas. The seal gas flows over the outer surface of the nozzle arm. Therefore, the seal gas removes the seal liquid adhering to the nozzle arm, and dries the outer surface of the nozzle arm.

The gas seal structure may be disposed closer to the internal space of the seal chamber than the liquid seal structure. With this arrangement, when the nozzle arm is moved into the seal chamber, any region of the outer surface of the nozzle arm is advanced into the seal chamber after the seal gas is supplied thereto. The seal liquid applied to the outer surface of the nozzle arm by the liquid seal structure is removed by the seal gas of the gas seal structure. This reliably prevents the ingress of the seal liquid in the internal space of the seal chamber.

The foregoing and other objects, features and effects of the present invention will become more apparent from the following detailed description of preferred embodiments with reference to the attached drawings.

BRIEF DESCRIPTION OF THE DRAWINGS

FIG. 6 is a sectional view taken along a section line VI-VI and seen in an arrow direction VI in FIG. 5.

FIG. 7 is a sectional view taken along a section line VII-VII and seen in an arrow direction VII in FIG. 5.

DETAILED DESCRIPTION OF PREFERRED EMBODIMENTS

Figure 1:
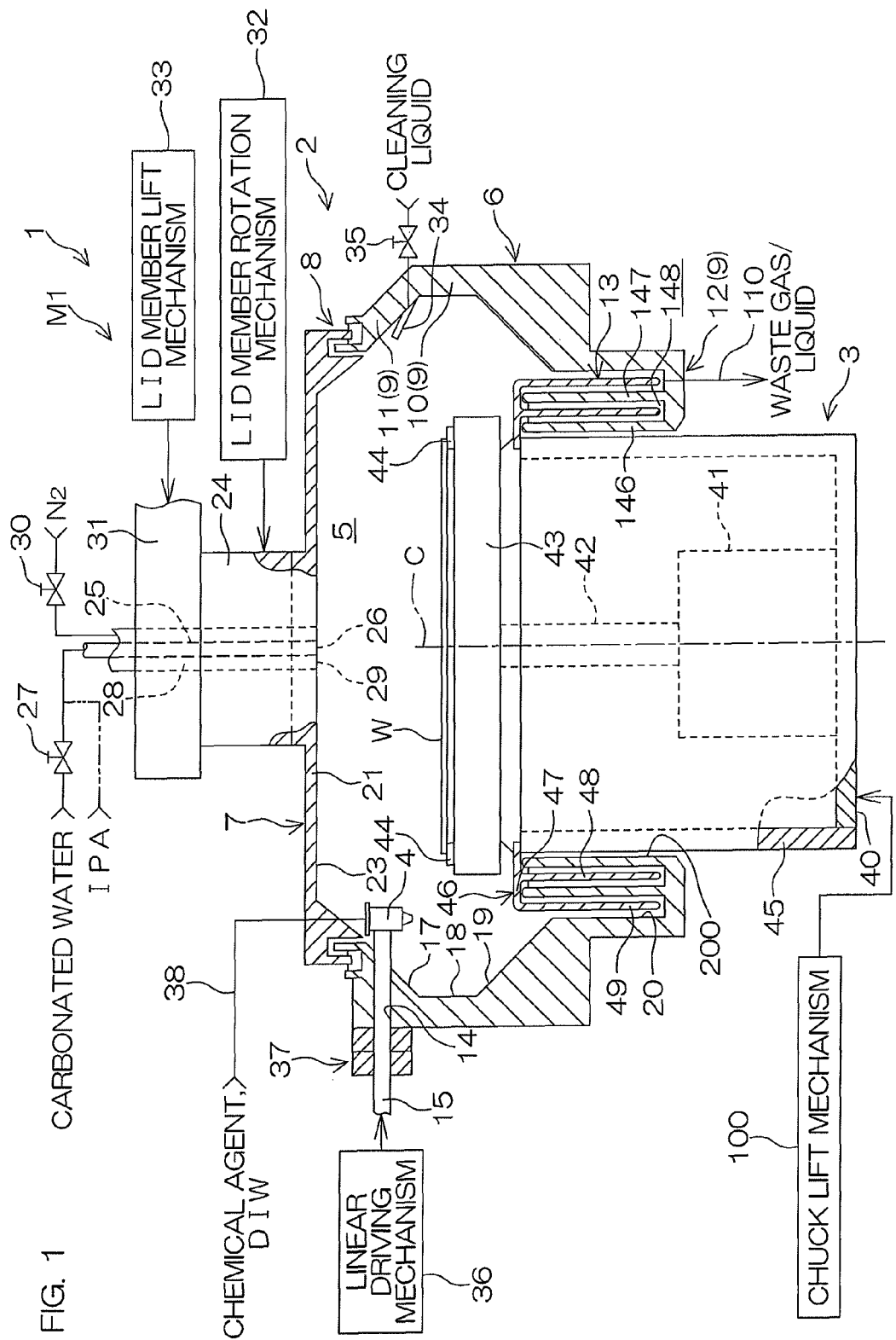
FIG. 1 is a schematic sectional view showing the construction of a substrate treatment apparatus according to one embodiment of the present invention.
Figure 2:
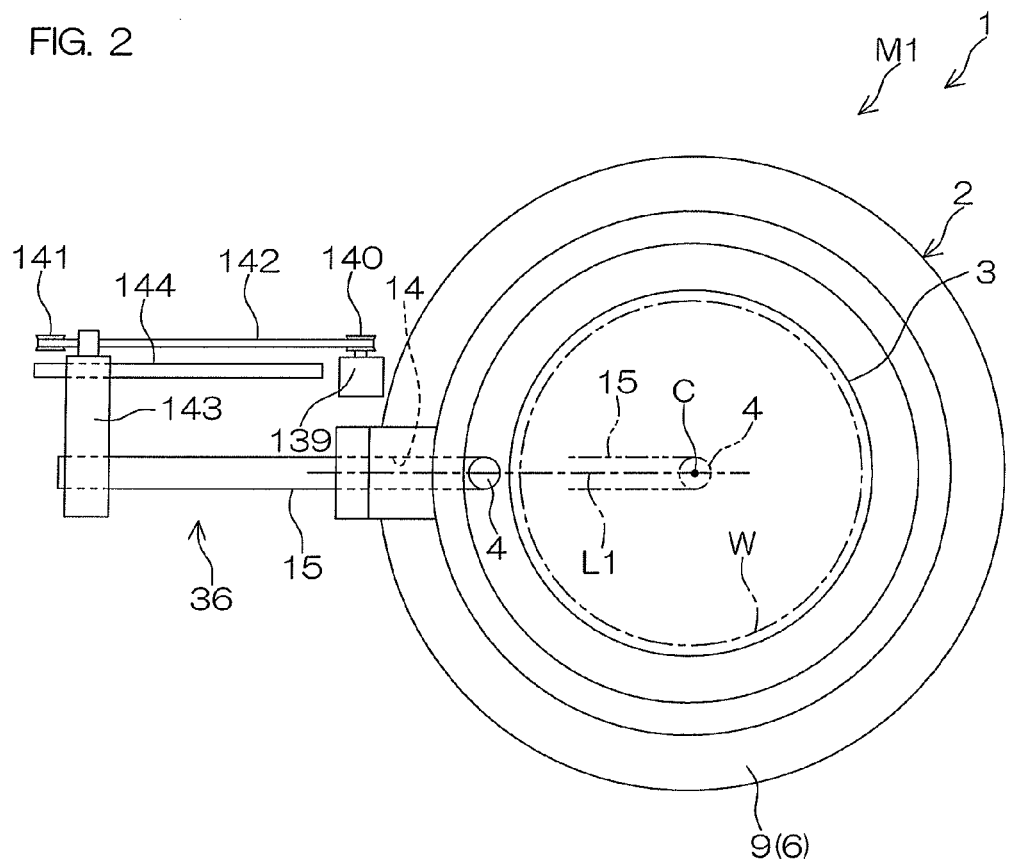
FIG. 2 is a schematic plan view for explaining the construction of the substrate treatment apparatus shown in FIG. 1.

FIG. 1 is a schematic sectional view showing the construction of a substrate treatment apparatus 1. FIG. 2 is a schematic plan view for explaining the construction of the substrate treatment apparatus 1. In FIG. 2, components of the substrate treatment apparatus 1 related to a treatment liquid nozzle (treatment liquid supplying unit) 4 and a nozzle arm 15 are mainly shown, and an arrangement not directly related to these components are omitted.

The substrate treatment apparatus 1 is of a single substrate treatment type, which is adapted, for example, to perform a wafer cleaning process (e.g., a residual polymer removing process) on a front surface (major surface) of a round semiconductor wafer W (as an exemplary substrate, hereinafter referred to simply as "wafer W") having a device formation region by using a diluted hydrofluoric acid solution as an exemplary chemical agent.

The substrate treatment apparatus 1 has a treatment module M1 for treating the wafer W. The treatment module M1 includes a seal chamber 2, a spin chuck (substrate holding/rotating unit) 3 which horizontally holds a single wafer W and rotates the wafer W about a vertical axis extending through the center of the wafer W in an internal space of the seal chamber 2, and a treatment liquid nozzle 4 for supplying a treatment liquid (a chemical agent or inert-gas-dissolved water as a rinse liquid) to a front surface of the wafer W held by the spin chuck 3 in the internal space of the seal chamber 2. The spin chuck 3 of the treatment module M1 is not entirely but partly accommodated in the internal space of the seal chamber 2 (i.e., only a spin base 43, holding members 44 and the like are accommodated in the internal space of the seal chamber 2). An exterior wall of a cover member 45 of the spin chuck 3 is exposed outside the seal chamber 2. A linear driving mechanism (linear driving unit) 36 for driving the nozzle arm 15 supporting the treatment liquid nozzle 4 is disposed outside the seal chamber 2. Therefore, the internal space of the seal chamber 2 is effectively reduced for internal space reduction. Thus, the internal space has a minimum volume sufficient to perform predetermined processes (the wafer cleaning process, a drying process and the like) on the wafer W.

The seal chamber 2 includes a generally hollow cylindrical chamber body 6 having an upper opening (opening) 5 and a lower opening 200, and a lid member 7 for covering and uncovering the upper opening 5 (in FIG. 2, the lid member 7 is removed from the seal chamber 2). The lid member 7 is rotatable with respect to the chamber body 6. The seal chamber 2 further includes a first liquid seal structure 8 which seals between the chamber body 6 and the lid member 7. More specifically, the first liquid seal structure 8 seals between an upper end of the chamber body 6 and a lower surface peripheral portion of the lid member 7 with de-ionized water as an exemplary seal liquid to shield the internal space of the seal chamber 2 from an atmosphere outside the seal chamber 2. The lower opening 200 of the chamber body 6 is closed by the spin chuck 3 (the cover member 45 of the spin chuck 3).

The chamber body 6 has a partition wall 9 which defines the internal space of the seal chamber 2. The partition wall 9 has a shape generally rotationally symmetrical about a rotation axis C of the wafer W to be rotated by the spin chuck 3 (hereinafter referred to simply as "rotation axis C"). The partition wall 9 includes a generally hollow cylindrical portion 10 having a center axis aligning with the rotation axis C, an inclined portion 11 obliquely extending upward from an upper end of the hollow cylindrical portion 10 toward the center axis (toward the rotation axis C), and a bottom portion 12 connected to a lower end of the hollow cylindrical portion 10 and having an annular shape as seen in plan. The hollow cylindrical portion 10 except an upper portion thereof has a thickness that is progressively increased toward the lower end thereof. A second liquid seal structure 13 seals between the bottom portion 12 and the spin chuck 3 (an upper end of the cover member 45 of the spin chuck 3). The inclined portion 11 has a passage hole 14 extending therethrough from an inner surface to an outer surface thereof. The nozzle arm 15 (to be described later) is inserted through the passage hole 14. The passage hole 14 is provided along a reference line L1 (to be described later with reference to FIG. 2).

The inner surface of the inclined portion 11 includes a first conical surface 17 defined about the rotation axis C and extending upward toward the rotation axis C. An inner surface of the hollow cylindrical portion 10 includes a hollow cylindrical surface 18 defined about the center axis C, and a conical waste liquid guide surface 19 defined about the rotation axis C and extending downward toward the rotation axis C. The treatment liquid (the chemical agent or the rinse liquid), which scatters around from a peripheral edge of the wafer W being rotated during a chemical agent treatment process or a rinsing process performed on the wafer W, is mainly received by the hollow cylindrical surface 18 and the waste liquid guide surface 19. The treatment liquid received by the hollow cylindrical surface 18 flows down over the waste liquid guide surface 19 together with the treatment liquid received by the waste liquid guide surface 19, and guided (led) from the waste liquid guide surface 19 into a waste gas/liquid channel 20 (to be described later).

The lid member 7 has a generally disk shape having a slightly greater diameter than the wafer W. As described above, the first liquid seal structure 8 seals between the lower surface outer peripheral portion of the lid member 7 and the upper end of the partition wall 9 of the chamber body 6. The lid member 7 except the peripheral portion thereof defines a round flat plate portion 21. A lower surface of the flat plate portion 21 includes a substrate opposing surface 23, which is a horizontal flat surface to be opposed to the front surface of the wafer W held by the spin chuck 3.

An upper rotation shaft 24 is fixed to an upper surface of the lid member 7 as extending along an axis aligned with the rotation axis C. The upper rotation shaft 24 has a hollow inside. An upper treatment liquid nozzle 25 for supplying carbonated water as the rinse liquid to the front surface of the wafer W is inserted through the inside of the upper rotation shaft 24. The upper treatment liquid nozzle 25 has an upper treatment liquid spout 26 for spouting the treatment liquid toward the rotation center of the front surface of the wafer W held by the spin chuck 3. The carbonated water is supplied to the upper treatment liquid nozzle 25 via a carbonated water valve 27. An inert gas flow passage (inert gas supplying unit) 28 for supplying nitrogen gas as an inert gas toward the center portion of the wafer W is defined between an interior wall of the upper rotation shaft 24 and an exterior wall of the upper treatment liquid nozzle 25. The inert gas flow passage 28 has an inert gas spout (inert gas supplying unit) 29 which opens in the substrate opposing surface 23. The nitrogen gas is supplied to the inert gas flow passage 28 via an inert gas valve (inert gas supplying unit) 30.

The upper rotation shaft 24 is rotatably attached to a distal end portion of a generally horizontal lid arm 31 as extending downward from the distal end portion of the lid arm 31. That is, the lid member 7 is supported by the lid arm 31. A lid member rotation mechanism (lid member rotating unit) 32 for rotating the lid member 7 substantially in synchronism with the wafer W rotated by the spin chuck 3 is connected to the upper rotation shaft 24.

A lid member lift mechanism 33 for moving up and down the lid arm 31 is connected to the lid arm 31. The lid member lift mechanism 33 is capable of moving up and down the lid member 7 between a closed position (shown in FIG. 1) at which the upper opening 5 of the chamber body 6 is closed with the lid member 7 and an open position (shown in FIG. 12A) at which the upper opening 5 of the chamber body 6 is open. The open position is spaced upward from the closed position. The lid member 7 is supported at the closed position and at the open position by the lid arm 31.

A cleaning liquid nozzle (cleaning liquid spouting unit) 34 for cleaning the inside of the seal chamber 2 is provided on an inner surface of the partition wall 9 of the chamber body 6 (more specifically, on a boundary between the first conical surface 17 and the hollow cylindrical surface 18). The cleaning liquid nozzle 34 is, for example, a straight nozzle which continuously spouts a cleaning liquid. The cleaning liquid nozzle 34 is provided on the inner surface of the partition wall 9 of the chamber body 6 with its spout directed obliquely upward. The cleaning liquid spouted from the spout of the cleaning liquid nozzle 34 is directed toward an intermediate portion between a center portion and the peripheral portion of the lower surface of the lid member 7. The cleaning liquid (e.g., de-ionized water) is supplied to the cleaning liquid nozzle 34 from a cleaning liquid supply source (not shown) via a cleaning liquid valve 35.

The treatment liquid nozzle 4 is attached to a distal end portion of the nozzle arm 15 extending above the spin chuck 3. The nozzle arm 15 has a rod shape horizontally linearly extending from the inside to the outside of the seal chamber 2. The nozzle arm 15 extends along the linear reference line L1 extending above the rotation axis C (see FIG. 2), and has a rectangular cross section (see FIGS. 5 and 6). The nozzle arm 15 is supported by the linear driving mechanism 36 provided outside the seal chamber 2 so as to be movable along the reference line L1.

The nozzle arm 15 is inserted through the passage hole 14 provided in the partition wall 9 of the chamber body 6. The passage hole 14 is present on the reference line L1. Since the nozzle arm 15 extending along the reference line L1 is moved along the reference line L1, the nozzle arm 15 is constantly passed through a portion of the partition wall 9 at which the reference line L1 intersects the partition wall 9. The passage hole 14 is provided in this portion of the partition wall 9, so that the passage hole 14 has a minimum size. A third seal structure 37 seals between the nozzle arm 15 and the partition wall 9 of the chamber body 6. The internal space of the seal chamber 2 can be easily maintained in a sealed state by minimizing the size of the passage hole 14.

A treatment liquid supply pipe 38 is connected to the treatment liquid nozzle 4. The chemical agent and the rinse liquid are selectively supplied as the treatment liquid to the treatment liquid supply pipe 38 from an in-pipe preparation unit 51 (to be described later with reference to FIG. 8). The treatment liquid (the chemical agent or the rinse liquid) is spouted from the treatment liquid nozzle 4 by supplying the treatment liquid to the treatment liquid supply pipe 38.

As shown in FIG. 2, the linear driving mechanism 36 includes a nozzle driving motor 139, a timing belt 142 stretched between an output shaft 140 of the nozzle driving motor 139 and a rotatable pulley 141, a connection member 143 connected to a middle portion of the timing belt 142, and a linear guide 144 which permits the connection member 143 to move only along the reference line L1 by restricting the movement of the connection member 143. The connection member 143 is connected to a proximal end portion of the nozzle arm 15 to support the nozzle arm 15. When the nozzle driving motor 139 is rotatively driven, the timing belt 142 is rotated to move the connection member 143 connected to the timing belt 142 along the reference line L1. Thus, the rotative driving force of the nozzle driving motor 139 is inputted to the nozzle arm 15 to move the nozzle arm 15 along the reference line L1.

The treatment liquid nozzle 4 is moved between a retracted position located on a lateral side of the wafer W held by the spin chuck 3 (as shown in FIG. 1, and indicated by a solid line in FIG. 2) and a position located above the front surface of the wafer W held by the spin chuck 3 (as indicated by a two-dot-and-dash line in FIG. 2) by the movement of the nozzle arm 15, whereby a treatment liquid spouting position at which the treatment liquid is spouted from the treatment liquid nozzle 4 can be moved over the front surface of the wafer W. Since the linear driving mechanism 36 is thus disposed outside the seal chamber 2, the size of the seal chamber 2 can be reduced. This makes it possible to reduce the volume of the internal space of the seal chamber 2 (for the internal space reduction).

Referring again to FIG. 1 alone, the spin chuck 3 will be described. The spin chuck 3 includes a horizontal base (exposed portion) 40, a spin motor 41 fixed onto the base 40, a vertically extending rotation shaft 42 to which the rotative driving force of the spin motor 41 is inputted, a disk-shaped spin base (substrate holding/rotating unit) 43 horizontally attached to an upper end of the rotation shaft 42, a plurality of holding members (substrate holding/rotating unit) 44 disposed on the spin base 43, and the cover member (exposed portion) 45 laterally surrounding the spin motor 41. The spin base 43 is, for example, a disk-shaped member having a slightly greater diameter than the wafer W. A lower end of the cover member 45 is fixed to an outer periphery of the base 40. The cover member 45 and the base 40 intimately contact each other, thereby preventing the atmosphere outside the seal chamber 2 from intruding into a casing defined by the cover member 45 and the base 40. The upper end of the cover member 45 is located adjacent the spin base 43. A flange member 46 is attached to the upper end of the cover member 45.

More specifically, the flange member 46 integrally includes a horizontal portion 47 generally horizontally extending outward radially from the upper end of the cover member 45, an inner wall 48 extending vertically downward from a radially middle portion of the horizontal portion 47, and an outer wall 49 extending vertically downward from an outer peripheral edge of the horizontal portion 47. The inner wall 48 and the outer wall 49 each have a hollow cylindrical shape defined about the rotation axis C. Lower edges of the inner wall 48 and the outer wall 49 are located at substantially the same height.

The holding members 44 are arranged on an upper surface peripheral portion of the spin base 43 along a circle conformal to the outer periphery of the wafer W in a properly spaced relation. The holding members 44 cooperatively hold the single wafer W in a horizontal attitude. With the wafer W held by the holding members 44, the rotative driving force of the spin motor 41 is inputted to the rotation shaft 42, whereby the wafer W thus held is rotated about the vertical rotation axis extending through the center of the wafer W.

In this embodiment, the spin chuck 3 (the cover member 45 of the spin chuck 3) closes the lower opening 200 of the chamber body 6. The spin base 43 and the holding members 44 are accommodated in the seal chamber 2, and the base 40 and almost all the cover member 45 except the upper end portion are exposed outside the seal chamber 2. The inner wall 48 of the flange member 46 defines a part of the second liquid seal structure 13, which seals between the chamber body 6 and the spin chuck 3.

The spin chuck 3 is not limited to the holding type spin chuck, but may be of a vacuum suction type (vacuum chuck), which is capable of vacuum-sucking a rear surface of the wafer W to hold the wafer W in a horizontal attitude and rotating about the vertical rotation axis in this state to rotate the wafer W held thereby.

Figure 12A:
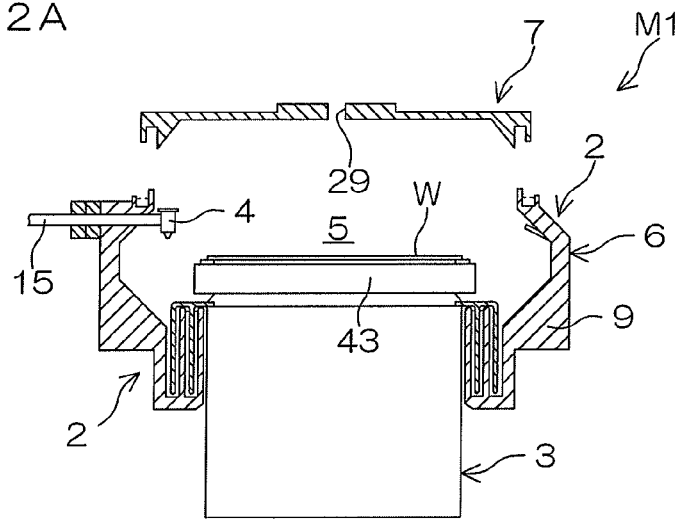
FIG. 12A is a schematic sectional view for explaining an exemplary substrate treatment process to be performed by the substrate treatment apparatus shown in FIG. 1.
Figure 12B:
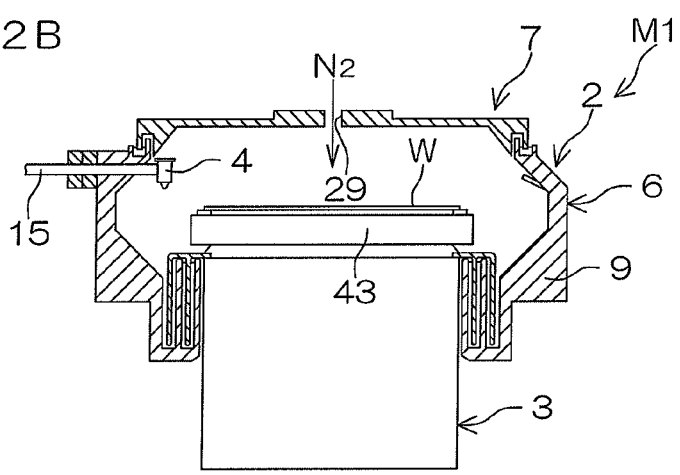
FIG. 12B is a schematic sectional view showing a step subsequent to the step shown in FIG. 12A.
Figure 12C:
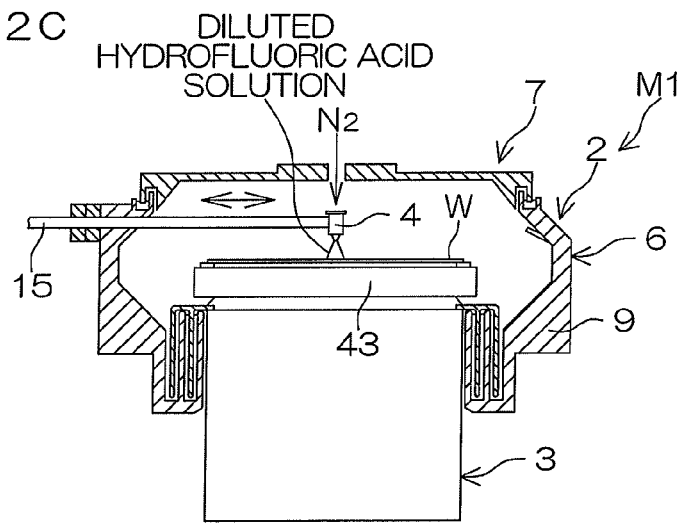
FIG. 12C is a schematic sectional view showing a step subsequent to the step shown in FIG. 12B.
Figure 12D:
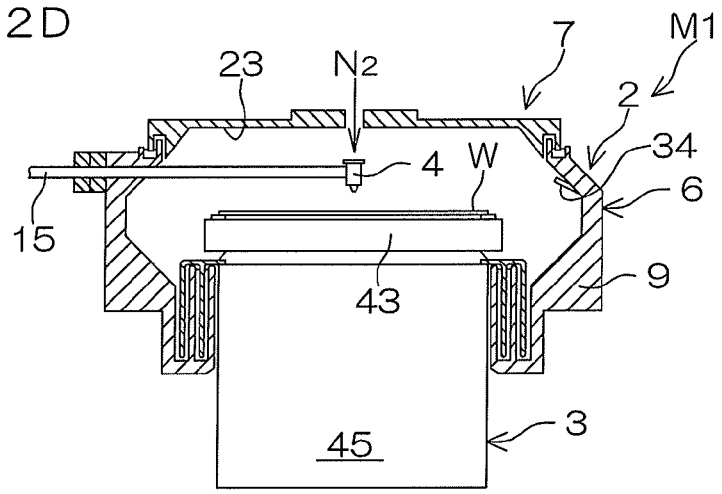
FIG. 12D is a schematic sectional view showing a step subsequent to the step shown in FIG. 12C.

In this embodiment, the spin chuck 3 is movable up and down. The substrate treatment apparatus 1 includes a chuck lift mechanism (first moving unit and second moving unit) 100 which moves up and down the spin chuck 3 among a treatment position (liquid treatment position) shown in FIG. 1, a spin-drying position (drying position) shown in FIG. 12E and a chamber cleaning position (lid cleaning position) shown in FIG. 12F. The chuck lift mechanism 100 includes, for example, a ball screw mechanism, a motor and the like, and is connected, for example, to the base 40 of the spin chuck 3. The treatment position is such that the chemical agent treatment processor the rinsing process is performed on the wafer W held by the spin chuck 3. The spin-drying position is spaced upward from the treatment position, and is such that the drying process is performed on the wafer W, and the wafer W is transferred to and from a transport robot (not shown). The chamber cleaning position is such that an interior wall of the seal chamber 2 (i.e., the substrate opposing surface 23 of the lid member 7 and the inner surface of the partition wall 9 of the chamber body 6) is cleaned.

In this embodiment, the internal space of the seal chamber 2 is reliably shielded from the outside of the seal chamber 2 by the first liquid seal structure 8, the second liquid seal structure 13 and the third seal structure 37. This prevents the atmosphere outside the seal chamber 2 from intruding into the seal chamber 2, and prevents the atmosphere inside the seal chamber 2 from leaking outside the seal chamber 2.

Figure 3:
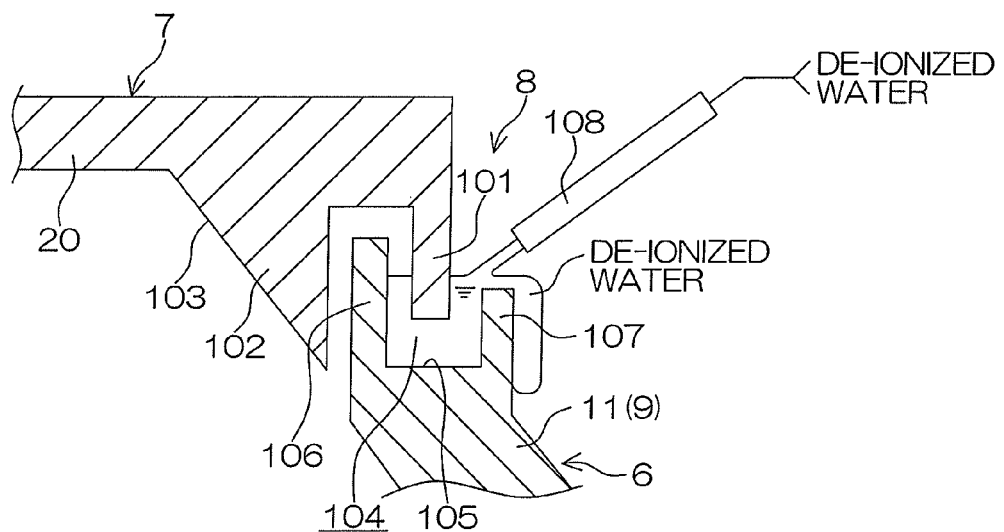
FIG. 3 is a schematic sectional view for explaining the construction of a first liquid seal structure and its peripheral arrangement shown in FIG. 1.

FIG. 3 is a schematic sectional view for explaining the construction of the first liquid seal structure 8 and its peripheral arrangement. Referring to FIGS. 1 and 3, the construction of the first liquid seal structure 8 and its peripheral arrangement will be described.

The lid member 7 includes a hollow cylindrical seal ring 101 provided in the peripheral portion thereof as extending vertically downward from a peripheral edge thereof, and a projection 102 provided radially inward of the seal ring 101 as projecting downward and having an annular shape as seen in plan. The projection 102 has a triangular cross section. The projection 102 has a conical lower surface 103 extending downward away from the rotation axis C.

A first seal channel 104 capable of retaining de-ionized water as the seal liquid is provided circumferentially in an upper end portion of the partition wall 9 of the chamber body 6, i.e., in an upper end portion of the inclined portion 11. The first seal channel 104 has an annular shape defined about the rotation axis C (see FIG. 1) as seen in plan. More specifically, the upper end portion of the inclined portion 11 integrally includes an upper end face 105 which is an annular flat surface as seen in plan, a hollow cylindrical inner wall 106 projecting vertically upward from an inner peripheral edge of the upper end face 105, and a hollow cylindrical outer wall 107 projecting vertically upward from an outer peripheral edge of the upper end face 105. The first seal channel 104 is defined by the upper end face 105, an outer surface of the inner wall 106 and an inner surface of the outer wall 107, which are arranged to form a generally U-shaped cross section. The seal ring 101 is located above the first seal channel 104. The first liquid seal structure 8 is provided by a combination of the seal ring 101 and the first seal channel 104. The de-ionized water is retained as the seal liquid in the first liquid seal structure 8.

When the lid member 7 is located at the closed position, a lower end portion of the seal ring 101 is inserted in the first seal channel 104 with a minute gap defined between a bottom of the first seal channel 104 and the lower end portion of the seal ring 101. When the lid member 7 is located at the closed position, the seal ring 101 is inserted in the first seal channel 104 to be immersed in the seal liquid, because the seal liquid is retained in the first seal channel 104. Therefore, the seal liquid seals between the seal ring 101 and the first seal channel 104.

A seal liquid supplying nozzle 108 for spouting the seal liquid is disposed on a lateral side of the lid member 7 with its spout directed toward the first seal channel 104. The seal liquid is always spouted from the seal liquid nozzle 108 during the actuation of the substrate treatment apparatus 1. Therefore, the seal liquid is always retained in the first seal channel 104. Since the seal liquid is always supplied into the first seal channel 104, there is no possibility that the seal liquid is depleted. Thus, the seal between the lid member 7 and the chamber body 6 can be maintained for a longer period of time. Further, the seal liquid in the first seal channel 104 is constantly replaced, thereby suppressing accumulation of contaminants in the seal liquid retained in the first seal channel 104.

An upper end face of the inner wall 106 is located at a higher level than an upper end face of the outer wall 107. Therefore, the seal liquid overflows out of the first seal channel 104 to the outside of the chamber body 6 over the upper end face of the outer wall 107, and further flows downward on an outer periphery of the chamber body 6. This eliminates the possibility that the seal liquid once retained in the first seal channel 104 flows into the chamber body 6, i.e., into the seal chamber 2. The seal liquid flowing down on the outer periphery of the chamber body 6 is drained through a drain passage (not shown) disposed outside the seal chamber 2.

When the lid member rotation mechanism 32 is driven with the lid member 7 located at the closed position, the lid member 7 is rotated about the rotation axis C. Since the seal liquid seals between the first seal channel 104 and the seal ring 101 being rotated, the internal space of the seal chamber 2 can be shielded from the atmosphere outside the seal chamber 2 even during the rotation of the lid member 7.

The lid member 7 has a relatively great radius (a greater radius than the wafer W in this embodiment), so that the seal ring 101 and the first seal channel 104 also each have a relatively great radius. When the lid member 7 is rotated at a higher rotation speed (e.g., in the drying process), therefore, a great amount of seal liquid is liable to scatter around from the first seal channel 104 with a greater circumferential speed of the seal ring 101. However, the seal ring 101 is always immersed in the seal liquid supplied into the first seal channel 104. Thus, the seal between the lid member 7 and the chamber body 6 can be maintained for a longer period of time.

When the lid member 7 is located at the closed position (as shown in FIGS. 1 and 3), the lower surface 103 of the projection 102 is generally flush with the first conical surface 17 of the inclined portion 11. In a chamber cleaning process, as will be described later, the de-ionized water is supplied as the cleaning liquid to the substrate opposing surface 23 of the lid member 7. The cleaning liquid supplied to the substrate opposing surface 23 receives a centrifugal force generated by the rotation of the lid member 7 to move to the peripheral portion of the lid member 7 over the substrate opposing surface 23 to reach the lower surface 103 of the projection 102. Since the lower surface 103 and the first conical surface 17 are generally flush with each other, the cleaning liquid reaching the lower surface 103 smoothly moves to the first conical surface 17. Thus, the cleaning liquid supplied to the substrate opposing surface 23 of the lid member 7 can be smoothly guided to the inner surface of the partition wall 9 of the chamber body 6.

Figure 4:
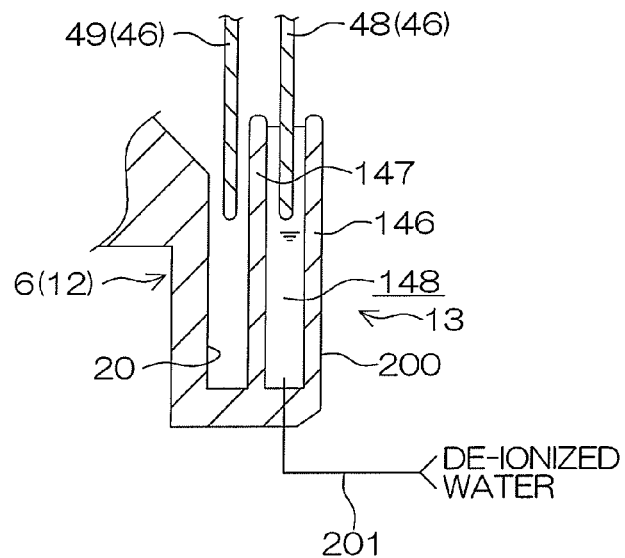
FIG. 4 is a schematic sectional view for explaining the construction of a second liquid seal structure and its peripheral arrangement shown in FIG. 1.

FIG. 4 is a schematic sectional view for explaining the construction of the second liquid seal structure 13 and its peripheral arrangement shown in FIG. 1. Referring to FIGS. 1 and 4, the second liquid seal structure 13 and its peripheral arrangement will be described.

The bottom portion 12 of the chamber body 6 includes an inner wall 146 projecting vertically upward from an inner peripheral edge of a bottom wall thereof, and an outer wall 147 projecting vertically upward from a radially middle portion of the bottom wall thereof. A second seal channel 148 for retaining de-ionized water as a seal liquid is defined by an outer surface of the inner wall 146, an inner surface of the outer wall 147 and a bottom surface of the bottom portion 12. The second seal channel 148 has an annular shape defined about the rotation axis C. The second seal channel 148 has a generally U-shaped section, and the inner wall 48 of the flange member 46 is located above the second seal channel 148. The de-ionized water is retained as the seal liquid in the second seal channel 148.

The waste gas/liquid channel 20 is defined by an outer surface of the outer wall 147, and an outer peripheral wall and the bottom of the bottom portion 12. The treatment liquid (the chemical agent and the inert-gas-dissolved water) used for the treatment of the wafer W and the cleaning liquid are drained in the waste gas/liquid channel 20. Further, de-ionized water is retained as a seal liquid in the waste gas/liquid channel 20 when the internal space of the seal chamber 2 is evacuated. The waste gas/liquid channel 20 has an annular shape defined about the rotation axis C (see FIG. 1) and surrounding the second seal channel 148. The waste gas/liquid channel 20 has a U-shaped section, and one end of a waste gas/liquid passage 110 (see FIG. 1) is connected to a bottom of the waste gas/liquid channel 20. The other end of the waste gas/liquid passage 110 is connected to a waste liquid treatment facility (not shown) and a waste gas treatment facility (not shown). The outer wall 49 of the flange member 46 is located above the waste gas/liquid channel 20.

When the spin chuck 3 is located at the treatment position (as shown in FIG. 1), a lower end portion of the inner wall 48 is inserted in the second seal channel 148 with a minute gap defined with respect to the bottom of the second seal channel 148.

Figure 12E:
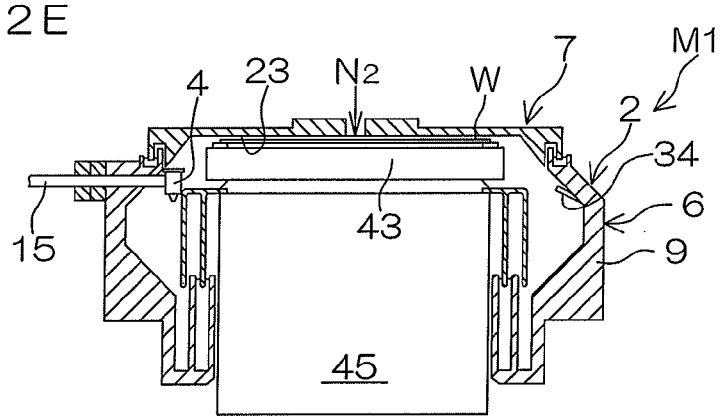
FIG. 12E is a schematic sectional view showing a step subsequent to the step shown in FIG. 12D.
Figure 12F:
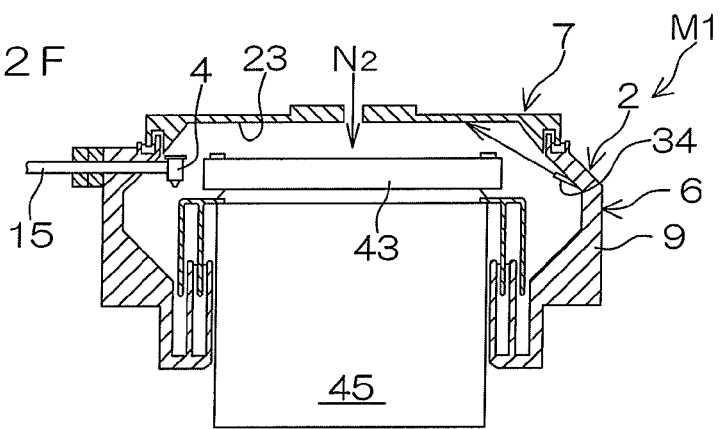
FIG. 12F is a schematic sectional view showing a chamber cleaning process.

When the spin chuck 3 is located at the spin-drying position (as shown in FIG. 12E), the lower end portion of the inner wall 48 horizontally overlaps a part of the second seal channel 148. Even in this state, the lower end portion of the inner wall 48 is partly inserted in the second seal channel 148.

The seal liquid is supplied to the second seal channel 148 through a seal liquid pipe 201. The seal liquid is always supplied to the second seal channel 148 during the actuation of the substrate treatment apparatus 1. Therefore, the second seal channel 148 is always filled with seal liquid. The seal liquid overflows out of the second seal channel 148 into the waste gas/liquid channel 20 to be guided to an external waste liquid facility from the waste gas/liquid channel 20 through the waste gas/liquid passage 110.

Figure 5:
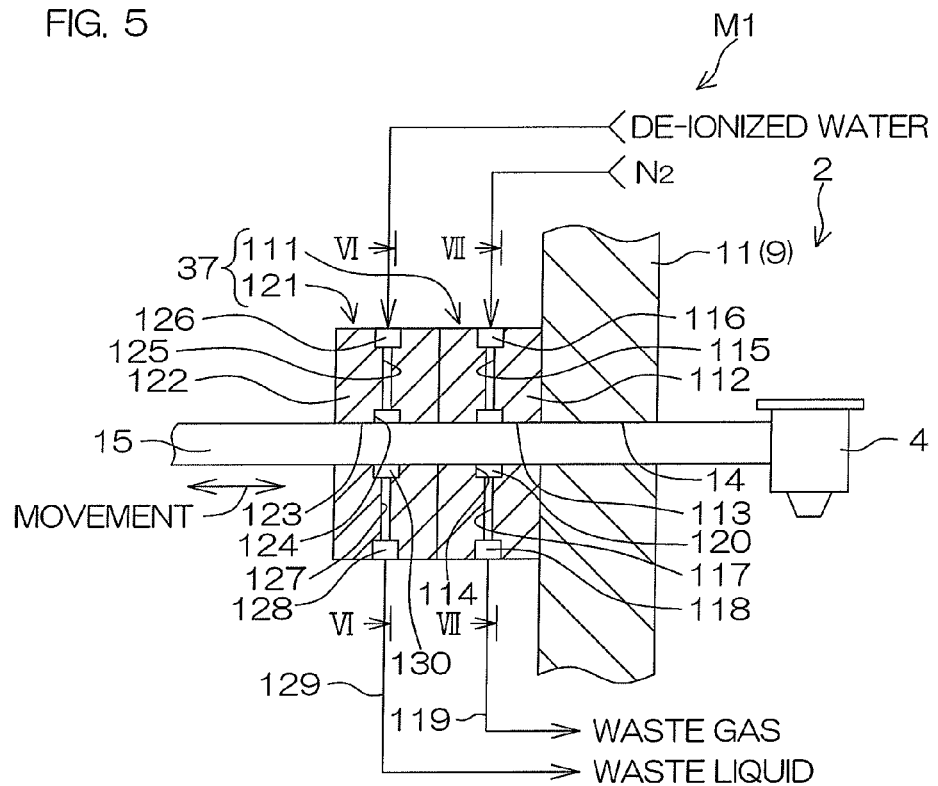
FIG. 5 is a schematic sectional view for explaining the construction of a third seal structure shown in FIG. 1.

FIG. 5 is a schematic sectional view for explaining the construction of the third seal structure 37 shown in FIG. 1. FIG. 6 is a sectional view taken along a section line VI-VI and seen in an arrow direction VI in FIG. 5. FIG. 7 is a sectional view taken along a section line VII-VII and seen in an arrow direction VII in FIG. 5.

As shown in FIG. 5, the third seal structure 37 includes a gas seal portion 111 fixed to an outer side surface of the partition wall 9 as covering the passage hole 14, and a liquid seal portion 121 fixed to the gas seal portion 111 on a side of the gas seal portion 111 opposite from the partition wall 9.

The liquid seal portion 121 has a liquid seal body 122 having a rectangular thick plate shape. The liquid seal body 122 has a first insertion hole 123 (see FIG. 5) provided in a middle portion thereof for insertion of the nozzle arm 15. The first insertion hole 123 extends thicknesswise through the liquid seal body 122 (laterally in FIG. 5). The first insertion hole 123 has a rectangular cross sectional shape that is generally conformal to the cross sectional shape of the nozzle arm 15.

The gas seal portion 111 has a gas seal body 112 having a rectangular thick plate shape. The gas seal body 112 has a second insertion hole 113 (see FIG. 5) provided in a middle portion thereof for insertion of the nozzle arm 15. The second insertion hole 113 extends thicknesswise through the gas seal body 112. The second insertion hole 113 has a rectangular cross sectional shape that is generally conformal to the cross sectional shape of the nozzle arm 15.

The second insertion hole 113 of the gas seal portion 111 and the first insertion hole 123 of the liquid seal portion 121 communicate with the passage hole 14 of the partition wall 9. One of opposite surfaces (a right surface in FIG. 5) of the gas seal body 112 is connected in intimate contact with the outer surface of the partition wall 9 of the chamber body 6. One of opposite surfaces (a right surface in FIG. 5) of the liquid seal body 122 is connected in intimate contact with the other surface (a left surface in FIG. 5) of the gas seal body 112. Therefore, the atmosphere of a space including the passage hole 14, the second insertion hole 113 and the first insertion hole 123 communicating with each other does not leak from between the partition wall 9 and the gas seal portion 111 or from between the gas seal portion 111 and the liquid seal portion 121.

The nozzle arm 15 is inserted through the first insertion hole 123 and the second insertion hole 113 in a slidable manner with respect to inner peripheral surfaces of the first and second insertion holes 123, 113. As will be described later, a first flow passage 130 is defined between the liquid seal portion 121 and an outer surface of the nozzle arm 15 inserted through the first insertion hole 123, and has a rectangular loop shape extending along the entire perimeter of the nozzle arm 15 to surround the outer surface of the nozzle arm 15. The first flow passage 130 is filled with de-ionized water serving as a seal liquid. As will be described later, a second flow passage 120 is defined between the gas seal portion 111 and the outer surface of the nozzle arm 15 inserted through the second insertion hole 113, and has a rectangular loop shape extending along the entire perimeter of the nozzle arm 15 to surround the outer surface of the nozzle arm 15.

During the chemical agent treatment process and the rinsing process, the treatment liquid (the chemical agent or a rinse liquid containing the chemical agent) is liable to scatter around from the wafer W to adhere to the outer surface of the nozzle arm 15. If the chemical agent is dried and crystallized on the outer surface of the nozzle arm 15, the dried treatment liquid component is disintegrated into particles, which will contaminate the wafer W being rotated on the spin chuck 3.

However, the first flow passage 130 having a rectangular loop shape is filled with the pure liquid, so that the seal liquid is brought into contact with the outer surface of the nozzle arm 15 and washes away the treatment liquid (the chemical agent or the rinse liquid) adhering to the outer surface of the nozzle arm 15. That is, the outer surface of the nozzle arm 15 is cleaned with the seal liquid.

Nitrogen gas, which flows in the second flow passage 120 having a rectangular loop shape, removes the seal liquid adhering to the outer surface of the nozzle arm 15 (the seal liquid applied by the liquid seal portion 121) and the like, whereby the outer surface of the nozzle arm 15 is dried.

Further, the gas seal portion 111 is disposed on a side of the liquid seal portion 121 closer to the internal space of the seal chamber 2. When the nozzle arm 15 is moved into the seal chamber 2, therefore, any region of the outer surface of the nozzle arm 15 is advanced into the seal chamber 2 after the nitrogen gas is supplied thereto. The seal liquid applied to the outer surface of the nozzle arm 15 by the liquid seal portion 121 is removed by the nitrogen gas in the gas seal portion 111. Thus, the seal liquid is reliably prevented from intruding into the internal space of the seal chamber 2.

Next, the liquid seal portion 121 will be described in detail with reference to FIGS. 5 and 6.

A first loop channel 124 having a rectangular loop shape is provided in a middle portion of the inner peripheral surface of the first insertion hole 123 (see FIG. 5) defined with respect to the thickness of the liquid seal body 122 as extending along the entire perimeter of the first insertion hole 123. A liquid inlet connection passage 125, which extends from an upper end face of the liquid seal body 122 to a middle portion of the liquid seal body 122 defined with respect to a direction perpendicular to both the thickness direction of the liquid seal body 122 and the vertical direction (or with respect to a direction perpendicular to the paper face of FIG. 5 and with respect to a transverse direction in FIGS. 6 and 7) (hereinafter referred to simply as "transversely middle portion of the liquid seal body 122"), opens in a portion of the first loop channel 124 opposed to an upper surface of the nozzle arm 15. The liquid inlet connection passage 125 extends vertically, and has an opening in the upper end face of the liquid seal body 122. The opening of the liquid inlet connection passage 125 serves as a liquid inlet port 126 for supplying the de-ionized water as the seal liquid into the liquid inlet connection passage 125. The seal liquid is supplied to the liquid inlet port 126 from a seal liquid supply source (not shown).

A liquid outlet connection passage 127, which extends from a lower end face of the liquid seal body 122 to the transversely middle portion of the liquid seal body 122, opens in a portion of the first loop channel 124 opposed to a lower surface of the nozzle arm 15. The liquid outlet connection passage 127 extends vertically, and has an opening in the lower end face of the liquid seal body 122. The opening of the liquid outlet connection passage 127 serves as a liquid outlet port 128 for draining the seal liquid from the liquid outlet connection passage 127. A drain passage 129 (see FIG. 5) is connected to the liquid outlet port 128 for guiding the seal liquid drained from the liquid outlet port 128 to the waste liquid facility.

With the nozzle arm 15 inserted through the first insertion hole 123, the first flow passage 130 having a rectangular loop shape is defined between the first loop channel 124 and the outer surface (the upper surface, the lower surface and side surfaces) of the nozzle arm 15. The first flow passage 130 communicates with the liquid inlet port 126 and the liquid outlet port 128.

The seal liquid supplied into the liquid inlet connection passage 125 from the liquid inlet port 126 flows through the liquid inlet connection passage 125, then through the first flow passage 130 on laterally opposite sides of the nozzle arm 15 and through the liquid outlet connection passage 127 to be drained from the liquid outlet port 128. Thus, the seal liquid seals between the inner peripheral surface of the liquid seal body 122 and the outer surface of the nozzle arm 15.

Next, the gas seal portion 111 will be described in detail with reference to FIGS. 5 and 7.

As described above, the gas seal portion 111 (see FIG. 5) has the gas seal body 112 having a rectangular thick plate shape. The gas seal body 112 has the second insertion hole 113 provided in the middle portion thereof for insertion of the nozzle arm 15. The second insertion hole 113 extends thicknesswise through the gas seal body 112. The second insertion hole 113 has a rectangular cross sectional shape that is generally conformal to the cross sectional shape of the nozzle arm 15.

A second loop channel 114 having a rectangular loop shape is provided in a middle portion of the inner peripheral surface of the second insertion hole 113 defined with respect to the thickness of the gas seal body 112 as extending along the entire perimeter of the second insertion hole 113. A gas inlet connection passage 115, which extends from an upper end face of the gas seal body 112 to a transversely middle portion of the gas seal body 112, opens in a portion of the second loop channel 114 opposed to the upper surface of the nozzle arm 15. The gas inlet connection passage 115 extends vertically, and has an opening in the upper end face of the gas seal body 112. The opening of the gas inlet connection passage 115 serves as a gas inlet port 116 for supplying the nitrogen gas as a seal gas into the gas inlet connection passage 115. The nitrogen gas is supplied from a nitrogen gas supply source (not shown) to the gas inlet port 116.

A gas outlet connection passage 117, which extends from a lower end face of the gas seal body 112 to the transversely middle portion of the gas seal body 112, opens in a portion of the second loop channel 114 opposed to the lower surface of the nozzle arm 15. The gas outlet connection passage 117 extends vertically, and has an opening in the lower end face of the gas seal body 112. The opening of the gas outlet connection passage 117 serves as a gas outlet port 118 for discharging the nitrogen gas from the gas outlet connection passage 117. A gas outlet passage 119 (see FIG. 5) is connected to the gas outlet port 118 for guiding the nitrogen gas discharged from the gas outlet port 118 to the waste gas treatment facility.

With the nozzle arm 15 inserted through the second insertion hole 113, the second flow passage 120 having a rectangular loop shape is defined between the second loop channel 114 and the outer surface (the upper surface, the lower surface and the side surfaces) of the nozzle arm 15. The second flow passage 120 communicates with the gas inlet port 116 and the gas outlet port 118.

The nitrogen gas supplied into the gas inlet connection passage 115 from the gas inlet port 116 flows through the gas inlet connection passage 115, then through the second flow passage 120 on laterally opposite sides of the nozzle arm 15 and through the gas outlet connection passage 117 to be discharged from the gas outlet port 118. Thus, the nitrogen gas seals between the inner peripheral surface of the gas seal body 112 and the outer surface of the nozzle arm 15.

Figure 8:
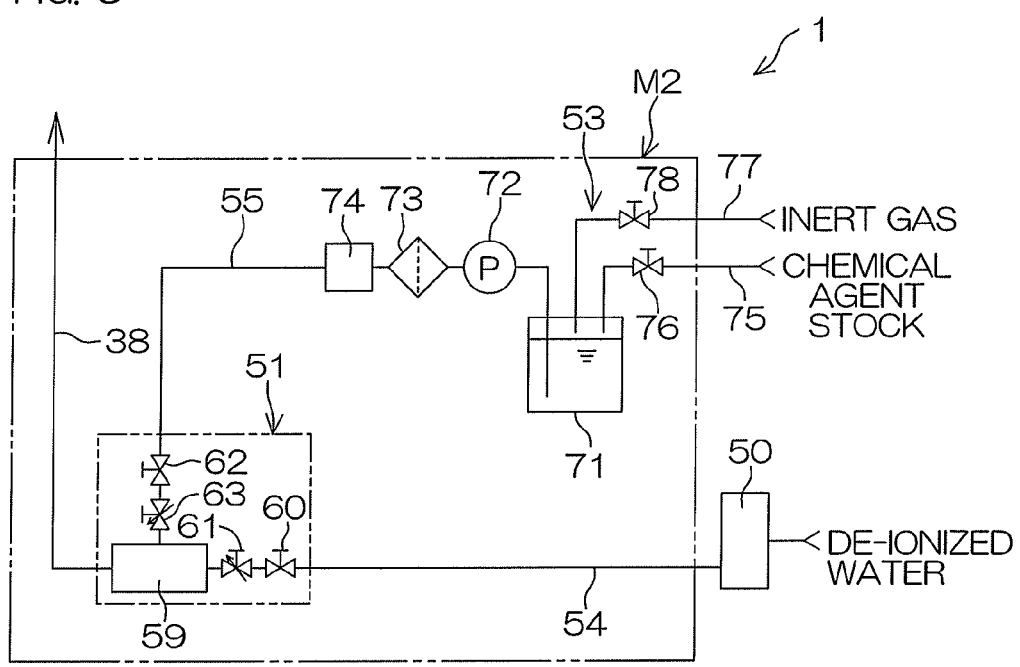
FIG. 8 is a schematic diagram illustrating an arrangement for supplying a treatment liquid to a treatment module shown in FIG. 2.

FIG. 8 is a schematic diagram illustrating an arrangement for supplying the treatment liquid to the treatment module M1 (see FIG. 1). The substrate treatment apparatus 1 further includes an inert-gas-dissolved water preparing unit 50 which removes oxygen from de-ionized water and adds an inert gas into the resulting de-ionized water to prepare the inert-gas-dissolved water, and a treatment liquid supply module M2 which supplies the treatment liquid to the treatment module M1.

The inert-gas-dissolved water preparing unit 50 is capable of preparing the inert-gas-dissolved water from de-ionized water supplied from a de-ionized water supply source (not shown). The inert-gas-dissolved water prepared by the inert-gas-dissolved water preparing unit 50 is supplied to the treatment liquid supply module M2. The inert-gas-dissolved water preparing unit 50 is, for example, adapted to remove oxygen from the de-ionized water and add the inert gas to the de-ionized water via a hollow fiber separation membrane having gas permeability and liquid impermeability. A separation membrane contactor available under the brand name of Liqui-Cel from Membrana GmbH, for example, is usable as the inert-gas-dissolved water preparing unit 50 having the above construction. The specific construction of the inert-gas-dissolved water preparing unit 50 is described, for example, in US2003/0230236A1.

The inert-gas-dissolved water preparing unit 50 removes oxygen from the supplied de-ionized water until the oxygen concentration of the de-ionized water is reduced to 20 ppb or lower. Further, the inert-gas-dissolved water preparing unit 50 adds highly pure nitrogen gas (e.g., having a nitrogen concentration of 99.999% to 99.999999999%) to the de-ionized water to prepare inert-gas-dissolved water having a nitrogen concentration of 7 ppm to 24 ppm. By controlling the nitrogen concentration of the inert-gas-dissolved water within the aforementioned range, the oxygen concentration of the inert-gas-dissolved water is substantially prevented from increasing over time.

Only an arrangement of the treatment liquid supply module M2 required for supplying the treatment liquid to the treatment liquid supply pipe 38 is shown in FIG. 8, but the treatment liquid supply module M2 may be adapted to supply the treatment liquid to an arrangement for supplying the treatment liquid to the upper treatment liquid nozzle 25 and other nozzles. The treatment liquid supply module M2 includes an in-pipe preparation unit 51 which mixes a chemical agent stock with the inert-gas-dissolved water to prepare a chemical agent, and a chemical agent supplying unit 53 which supplies the chemical agent stock into the in-pipe preparation unit 51.

The term "chemical agent stock" means a chemical agent yet to be mixed with the inert-gas-dissolved water. Examples of the chemical agent stock include hydrofluoric acid (HF), hydrochloric acid (HCl), a mixture of hydrofluoric acid and IPA (isopropyl alcohol), and ammonium fluoride ($NH_4F$). Where hydrofluoric acid is used as the chemical agent stock, hydrofluoric acid and the inert-gas-dissolved water are mixed (blended) in a predetermined ratio to prepare a diluted hydrofluoric acid solution (DHF) in the in-pipe preparation unit 51.

The in-pipe preparation unit 51 is connected to the inert-gas-dissolved water preparing unit 50 via a supply pipe 54. The inert-gas-dissolved water is supplied to the in-pipe preparation unit 51 from the inert-gas-dissolved water preparing unit 50 through the supply pipe 54. The in-pipe preparation unit 51 is connected to the chemical agent supplying unit 53 via a chemical agent supply pipe 55. The chemical agent stock is supplied to the in-pipe preparation unit 51 from the chemical agent supplying unit 53 through the chemical agent supply pipe 55. The in-pipe preparation unit 51 mixes the chemical agent stock supplied from the chemical agent supplying unit 53 with the inert-gas-dissolved water supplied from the inert-gas-dissolved water preparing unit 50 to prepare the chemical agent as the treatment liquid.

The in-pipe preparation unit 51 is connected to the treatment liquid supply pipe 38. The chemical agent is supplied as the treatment liquid to the treatment liquid nozzle 4 through the treatment liquid supply pipe 38. It is also possible to supply the inert-gas-dissolved water as it is as the rinse liquid to the treatment liquid nozzle 4 through the treatment liquid supply pipe 38 without mixing the chemical agent stock with the inert-gas-dissolved water supplied from the inert-gas-dissolved water preparing unit 50 in the in-pipe preparation unit 51. Thus, the chemical agent and the inert-gas-dissolved water can be selectively supplied to the treatment liquid nozzle 4.

The in-pipe preparation unit 51 includes a mixing section 59 provided in the form of a pipe in which the chemical agent stock and the inert-gas-dissolved water are mixed together, a valve 60 and a flow rate control valve 61 provided in the supply pipe 54, and a chemical agent valve 62 and a chemical agent flow rate control valve 63 provided in the chemical agent supply pipe 55. The supply pipe 54 and the chemical agent supply pipe 55 are connected to the mixing section 59.

With the valve 60 being open, the inert-gas-dissolved water is supplied to the mixing section 59 at a predetermined flow rate controlled by the flow rate control valve 61. With the chemical agent valve 62 being open, the chemical agent stock is supplied to the mixing section 59 at a predetermined flow rate controlled by the chemical agent flow rate control valve 63. By opening the chemical agent valve 62 with the valve 60 being open, the chemical agent stock is injected into the inert-gas-dissolved water flowing through the mixing section 59 to be mixed with the inert-gas-dissolved water. Therefore, the chemical agent can be prepared as having a predetermined formulation by controlling the amount of the chemical agent stock and the amount of the inert-gas-dissolved water to be supplied into the mixing section 59. By opening the valve 60 with the chemical agent valve 62 being closed, only the inert-gas-dissolved water is supplied into the mixing section 59. Thus, it is possible to supply the inert-gas-dissolved water as it is as the rinse liquid to the treatment liquid supply pipe 38 without mixing the chemical agent stock with the inert-gas-dissolved water.

The chemical agent supplying unit 53 includes a chemical agent tank 71 which stores the chemical agent stock, and the chemical agent supply pipe 55 through which the chemical agent stock is supplied to the in-pipe preparation unit 51 from the chemical agent tank 71. The chemical agent tank 71 is a closed container, so that the internal space of the chemical agent tank 71 is shielded from the outside. One end of the chemical agent supply pipe 55 is connected to the chemical agent tank 71. A pump 72, a filter 73 and a degassing unit 74 are provided in this order from the chemical agent tank 71 in the chemical agent supply pipe 55. The degassing unit 74 has substantially the same construction as the inert-gas-dissolved water preparing unit 50, except that the inert gas is not added.

A chemical agent supply pipe 75 is connected to the chemical agent tank 71. The chemical agent stock is supplied to the chemical agent tank 71 from a chemical agent stock supply source (not shown) through the chemical agent supply pipe 75. A chemical agent valve 76 for switching on and off the supply of the chemical agent stock to the chemical agent tank 71 is provided in the chemical agent supply pipe 75. An unused chemical agent stock is supplied to the chemical agent tank 71 when the amount of the chemical agent stock present in the chemical agent tank 71 is reduced to a predetermined level or lower. Thus, the chemical agent tank 71 is replenished with the unused chemical agent stock.

An inert gas supply pipe 77 is connected to the chemical agent tank 71. The inert gas is supplied to the chemical agent tank 71 from an inert gas supply source (not shown) through the inert gas supply pipe 77. An inert gas valve 78 for switching on and off the supply of the inert gas to the chemical agent tank 71 is provided in the inert gas supply pipe 77. The inert gas is, for example, always supplied to the chemical agent tank 71.

By supplying the inert gas into the chemical agent tank 71, air can be expelled from the chemical agent tank 71. Therefore, the increase in the amount of oxygen dissolved in the chemical agent stock stored in the chemical agent tank 71 is suppressed or prevented, which may otherwise occur when oxygen contained in the air in the chemical agent tank 71 is dissolved in the chemical agent stock. It is also possible to pressure-feed the chemical agent stock from the chemical agent tank 71 into the chemical agent supply pipe 55 by pressuring the inside of the chemical agent tank 71 by the inert gas.

The chemical agent stock in the chemical agent tank 71 is pumped out of the chemical agent tank 71 by the pressure of the inert gas or the suction force of the pump 72. The pressure of the chemical agent stock thus pumped out increases by the pump 72, and the chemical agent stock is passed through the filter 73 for removal of foreign matter. Further, the chemical agent stock passed through the filter 73 is degassed by the degassing unit 74, whereby the dissolved oxygen amount is reduced. Thereafter, the chemical agent stock having a dissolved oxygen amount thus reduced is supplied into the in-pipe preparation unit 51.

Figure 9:
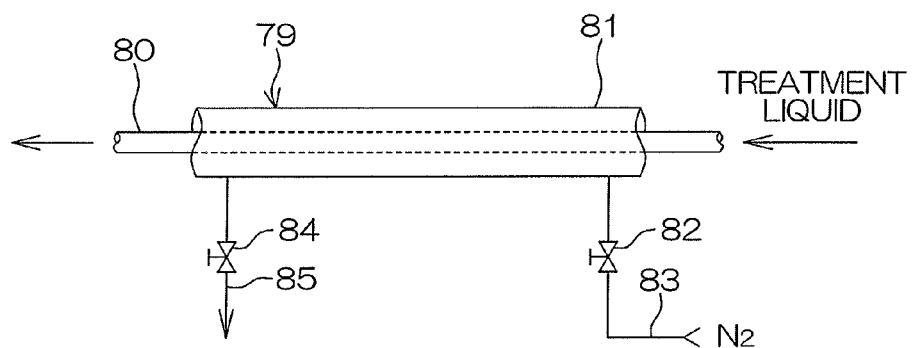
FIG. 9 is a schematic diagram of piping provided in the substrate treatment apparatus shown in FIG. 1.

FIG. 9 is a schematic diagram of piping provided in the substrate treatment apparatus 1.

Pipes including the treatment liquid pipe 38 and the like through which the treatment liquid flows each have a structure as shown in FIG. 9. These pipes will hereinafter be generally referred to as "piping 79".

The piping 79 has a double pipe structure including an inner pipe 80 through which the treatment liquid flows and an outer pipe 81 which surrounds the inner pipe 80. The inner pipe 80 is supported in the outer pipe 81 by a support member (not shown) present between the inner pipe 80 and the outer pipe 81. The inner pipe 80 is supported in noncontact with the outer pipe 81. A tubular space is defined between the inner pipe 80 and the outer pipe 81. The inner pipe 80 and the outer pipe 81 are each made of, for example, a fluororesin, more specifically, PFA (perfluoroalkyl vinyl ether/tetrafluoroethylene copolymer) excellent in chemical resistance and heat resistance. The PFA is permeable to oxygen.

The outer pipe 81 is connected to an inert gas supply pipe 83 having an inert gas valve 82 and a gas outlet pipe 85 having a gas outlet valve 84. By opening the inert gas valve 82, the inert gas (e.g., nitrogen gas) is supplied from an inert gas supply source (not shown) into the outer pipe 81 through the inert gas supply pipe 83. Thus, the space between the inner pipe 80 and the outer pipe 81 is filled with the inert gas. Further, the gas is discharged from the space between the inner pipe 80 and the outer pipe 81 by opening the gas outlet valve 84.

By opening the inert gas valve 82 with the gas outlet valve 84 being open, air is expelled from the space between the inner pipe 80 and the outer pipe 81, so that the atmosphere of this space can be replaced with an inert gas atmosphere. Thus, the inner pipe 80 is surrounded by the inert gas. After the atmosphere of the space between the inner pipe 80 and the outer pipe 81 is replaced with the inert gas atmosphere, the inert gas valve 82 and the gas outlet valve 84 are closed, whereby the inner pipe 80 can be kept surrounded by the inert gas.

With the inner pipe 80 being surrounded by the inert gas, the amount of oxygen intruding into the inner pipe 80 can be reduced. Thus, the increase in the oxygen concentration of the treatment liquid flowing through the inner pipe 80 is suppressed or prevented, which may otherwise occur when oxygen is dissolved in the treatment liquid.

Figure 10:
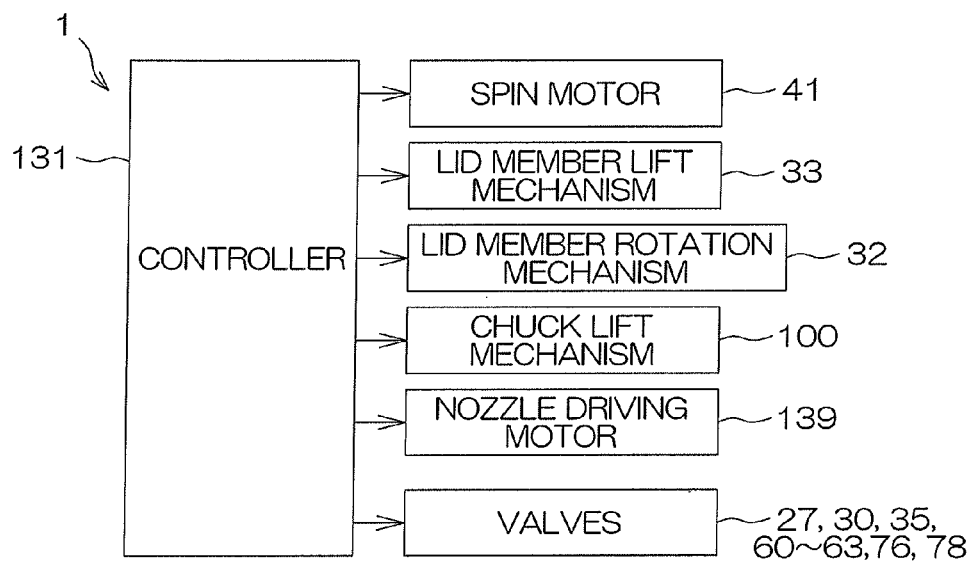
FIG. 10 is a block diagram for explaining the electrical construction of the substrate treatment apparatus shown in FIG. 1.

FIG. 10 is a block diagram for explaining the electrical construction of the substrate treatment apparatus 1.

The substrate treatment apparatus 1 includes a controller (chamber cleaning control unit and drying control unit) 131 including a microcomputer. The controller 131 controls the operation of the spin motor 41, the lid member lift mechanism 33, the lid member rotation mechanism 32, the chuck lift mechanism 100, the nozzle driving motor 139 and the like. Further, the controller 131 controls the opening and closing of the valves 27, 30, 35, 60 to 63, 76, 78 provided in the substrate treatment apparatus 1.

Figure 11:
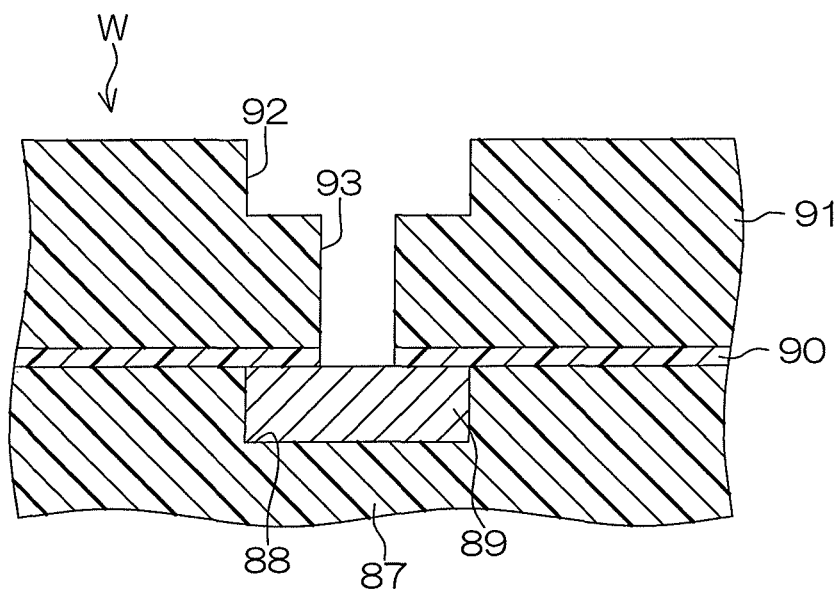
FIG. 11 is a sectional view for explaining an exemplary surface state of a wafer W to be treated by the substrate treatment apparatus shown in FIG. 1.

FIG. 11 is a sectional view for explaining an exemplary surface state of a wafer W to be treated by the substrate treatment apparatus 1.

As will be described later, a wafer W to be transported into the substrate treatment apparatus 1 typically includes an exposed metal pattern, and often has a polymer residue (a residue resulting from dry etching or ashing) adhering to a front surface thereof. The metal pattern may be a single layer film such as of copper, tungsten or other metal, or may be a multilayer film including a plurality of laminated metal films. An example of the multilayer film is a laminate film including a copper film and a barrier metal film provided on a surface of the copper film for prevention of diffusion of copper.

As shown in FIG. 11, the wafer W includes an interlevel insulating film 87 in a front surface thereof. The interlevel insulating film 87 has a lower wiring channel 88 provided in an upper surface thereof. A copper wiring 89 is buried in the lower wiring channel 88. A low-dielectric-constant insulating film 91 as an exemplary film to be processed is provided on the interlevel insulating film 87 via an etching stopper film 90. The low-dielectric-constant insulating film 91 has an upper wiring channel 92 provided in an upper surface thereof. The low-dielectric-constant insulating film 91 has a via-hole 93 extending from a bottom surface of the upper wiring channel 92 to a surface of the copper wiring 89. Copper is buried simultaneously in the upper wiring channel 92 and the via-hole 93.

To form the upper wiring 92 and the via-hole 93, a hard mask is formed on the low-dielectric-constant insulating film 91, and then a portion of the low-dielectric-constant insulating film 91 exposed from the hard mask is removed by a dry-etching process. After the formation of the upper wiring channel 92 and the via-hole 93, the hard mask which is now unnecessary is removed from the low-dielectric-constant insulating film 91 by an ashing process. During the dry-etching process and the ashing process, reaction products containing components of the low-dielectric-constant insulating film 91 and the hard mask adhere as the polymer residue to the surface of the low-dielectric-constant insulating film 91 (including interior surfaces of the upper wiring channel 92 and the via-hole 93). After the ashing process, the polymer residue is removed from the surface of the low-dielectric-constant insulating film 91 by supplying a polymer removing liquid to the front surface of the wafer W. An exemplary process to be performed for removing the polymer residue from the front surface of the wafer W by the substrate treatment apparatus 1 will hereinafter be described.

FIGS. 12A to 12F are process diagrams for explaining the exemplary wafer treatment process to be performed by the substrate treatment apparatus 1. Referring to FIGS. 1, 8, 10 and 12A to 12F, the exemplary wafer treatment process to be performed by the substrate treatment apparatus 1 will be described.

Prior to the treatment of the wafer W, as shown in FIG. 12A, the lid member 7 is located at the open position which is spaced upward from the spin base 43 of the spin chuck 3. Therefore, the upper opening 5 of the seal chamber 2 is open. Further, the spin chuck 3 is moved up to the spin-drying position (as shown in FIG. 12E) to be in stand-by at the spin-drying position. The treatment liquid nozzle 4 is retracted to the retracted position on the lateral side of the spin chuck 3. The valves 27, 30, 35, 60 to 63, 76, 78 are closed.

The wafer W subjected to the ashing process is transported into the substrate treatment apparatus 1 by the transport robot (not shown), and held by the spin chuck 3 located at the spin-drying position with its front surface up. The controller 131 controls the chuck lift mechanism 100 to move down the spin chuck 3 toward the treatment position with the wafer W held by the spin chuck 3. Further, the controller 131 controls the lid member lift mechanism 33 to move down the lid member 7 to the closed position (see FIG. 1). Thus, the upper opening 5 of the chamber body 6 is closed by the lid member 7 (see FIG. 12B). Thus, the internal space of the seal chamber 2 is sealed from the outside, so that the seal chamber 2 practically functions as a sealed chamber.

Then, as shown in FIG. 12B, an inert gas purging process is performed to replace the airy atmosphere of the internal space of the seal chamber 2 with an inert gas atmosphere (nitrogen gas atmosphere). More specifically, the controller 131 opens the inert gas valve 30 to supply the nitrogen gas into the internal space of the seal chamber 2 from the inert gas spout 29. The flow rate of the nitrogen gas to be spouted from the inert gas spout 29 at this time is, for example, 50 to 300 L/min, preferably 150 L/min. The nitrogen gas spouted from the inert gas spout 29 spreads in the internal space of the seal chamber 2 to expel the air from the seal chamber 2 through a gas outlet port of the waste gas/liquid channel 20 (see FIGS. 1 and 4). Thus, the internal atmosphere of the seal chamber 2 is replaced with the nitrogen gas atmosphere. The supply of the nitrogen gas into the seal chamber 2 is continued until the end of the drying process.

In this embodiment, the wafer W is kept stationary (in a non-rotated state) during the nitrogen gas purging process. However, the controller 131 may control the spin motor 41 to rotate the wafer W.

The inert gas purging process is continued until the oxygen concentration of the internal space of the seal chamber 2 reaches a predetermined low concentration level (e.g., 100 ppm or lower). Whether the oxygen concentration of the inside of the seal chamber 2 reaches the predetermined low concentration level may be determined based on an oxygen concentration detected in the seal chamber 2 by an oxygen concentration sensor (not shown) disposed on the interior surface of the partition wall 9 of the chamber body 6, or based on whether a period of time during which the nitrogen gas is spouted from the inert gas spout 29 reaches a predetermined period. After the oxygen concentration of the inside of the seal chamber 2 reaches the predetermined low concentration level, the chemical agent treatment process (see FIG. 12C) is performed on the wafer W for removing the polymer residue from the front surface of the wafer W.

At the start of the chemical agent treatment process, the controller 131 controls the spin motor 41 to rotate the wafer W at a predetermined liquid treatment speed (10 to 500 rpm, preferably 250 rpm).

Further, the controller 131 controls the in-pipe preparation unit 51 to spout the diluted hydrofluoric acid solution as the chemical agent from the treatment liquid nozzle 4. More specifically, the controller 131 opens the chemical agent valve 62 and the valve 60. With the chemical agent valve 62 and the valve 60 being open, hydrofluoric acid (chemical agent stock) and the inert-gas-dissolved water are supplied into the mixing section 59. At this time, the controller 131 further controls the opening degrees of the flow rate control valve 61 and the chemical agent flow rate control valve 63 to control the mixing ratio and the spout flow rates (supply flow rates) to desired values for the preparation of the diluted hydrofluoric acid solution. Thus, the diluted hydrofluoric acid solution having the aforementioned predetermined formulation is prepared by injecting hydrofluoric acid into the inert-gas-dissolved water flowing through the mixing section 59. The diluted hydrofluoric acid solution is an example of the chemical agent and an example of the polymer removing liquid. In this embodiment, the diluted hydrofluoric acid solution is prepared by mixing hydrofluoric acid and the de-ionized water in a mixing ratio of 1:10 to 1:1800, preferably 1:10 to 1:800, in the mixing section 59. The spout flow rate (supply flow rate) of the diluted hydrofluoric acid solution prepared in the mixing section 59 is 0.5 L/min to 3 L/min, preferably 1 L/min. The diluted hydrofluoric acid solution prepared in the mixing section 59 is supplied to the treatment liquid supply pipe 38 and spouted toward the front surface of the wafer W from the treatment liquid nozzle 4. Since the diluted hydrofluoric acid solution to be spouted from the treatment liquid nozzle 4 is prepared by diluting hydrofluoric acid degassed for the removal of oxygen by the degassing unit 74 with the de-ionized water degassed for the removal of oxygen by the inert-gas-dissolved water preparing unit 50, the oxygen concentration is sufficiently reduced.

In the chemical agent treatment process, as shown in FIG. 12C, the controller 131 controls the nozzle driving motor 139 to reciprocally move the nozzle arm 15 within a predetermined range. Thus, a supply position at which the diluted hydrofluoric acid solution spouted from the treatment liquid nozzle 4 is supplied onto the front surface of the wafer W is reciprocally moved along a straight line crossing the rotation direction of the wafer W within a range from the rotation center of the wafer W to the peripheral edge of the wafer W. Further, the diluted hydrofluoric acid solution supplied to the front surface of the wafer W spreads over the entire front surface of the wafer W. Thus, the diluted hydrofluoric acid solution is evenly supplied over the entire front surface of the wafer W. The polymer residue present on the front surface of the wafer W is removed by the chemical power of the diluted hydrofluoric acid solution supplied onto the front surface of the wafer W from the treatment liquid nozzle 4. The diluted hydrofluoric acid solution supplied onto the front surface of the wafer W scatters around from the peripheral edge of the wafer W laterally of the wafer W. At this time, the treatment liquid scattering from the front surface of the wafer W mainly adheres to the inner surface of the partition wall 9 of the chamber body 6 (particularly, the hollow cylindrical surface 18 and the waste liquid guide surface 19), the outer surface of the nozzle arm 15 and the treatment liquid nozzle 4.

During the chemical agent treatment process, the nitrogen gas is supplied into the internal space of the seal chamber 2. Therefore, the internal space of the seal chamber 2 is maintained in the nitrogen gas atmosphere to suppress or prevent the increase in the oxygen concentration of the internal space of the seal chamber 2. This substantially prevents oxygen in the atmosphere from being dissolved in the diluted hydrofluoric acid solution spouted from the treatment liquid nozzle 4, thereby suppressing or preventing the increase in the oxygen concentration of the diluted hydrofluoric acid solution.

Thus, the diluted hydrofluoric acid solution having a sufficiently reduced oxygen concentration can be supplied onto the front surface of the wafer W. This suppresses or prevents an oxidation reaction which may otherwise occur due to oxygen dissolved in the diluted hydrofluoric acid solution. As a result, the wafer W is substantially free from undesired etching, even if the chemical agent (diluted hydrofluoric acid solution) capable of etching an oxide is supplied onto the wafer W.

After the chemical agent treatment process is performed for a predetermined period (e.g., 10 to 60 seconds, preferably 30 seconds), the rinsing process (see FIG. 12D) is performed on the wafer W for rinsing away the chemical agent from the front surface of the wafer W.

More specifically, the controller 131 closes the chemical agent valve 62 with the valve 60 of the in-pipe preparation unit 51 kept open. With the chemical agent valve 62 closed and with the valve 60 open, only the inert-gas-dissolved water is supplied to the mixing section 59. Therefore, the inert-gas-dissolved water is supplied into the treatment liquid supply pipe 38, and spouted as the rinse liquid from the treatment liquid nozzle 4.

In the rinsing process, the controller 131 controls the nozzle driving motor 139 to reciprocally move the nozzle arm 15 within the predetermined range. Thus, a supply position at which the inert-gas-dissolved water spouted from the treatment liquid nozzle 4 is supplied on the front surface of the wafer W is reciprocally moved along the straight line crossing the rotation direction of the wafer W within the range from the rotation center of the wafer W to the peripheral edge of the wafer W. Further, the inert-gas-dissolved water supplied to the front surface of the wafer W spreads over the entire front surface of the wafer W, whereby the diluted hydrofluoric acid solution adhering to the front surface of the wafer W is rinsed away with the inert-gas-dissolved water. Then, the inert-gas-dissolved water containing the diluted hydrofluoric acid solution is spun away by the rotation of the wafer W to scatter laterally from the peripheral edge of the wafer W. At this time, the inert-gas-dissolved water containing the diluted hydrofluoric acid solution mainly adheres to the inner surface of the partition wall 9 of the chamber body 6 (particularly, the hollow cylindrical surface 18 and the waste liquid guide surface 19), the outer surface of the nozzle arm 15 and the treatment liquid nozzle 4.

The inert-gas-dissolved water spouted from the treatment liquid nozzle 4 has been degassed for the removal of oxygen by the inert-gas-dissolved water preparing unit 50, so that the amount of oxygen dissolved in the inert-gas-dissolved water is sufficiently reduced. Further, the oxygen concentration of the inert-gas-dissolved water is substantially prevented from increasing over time, because the nitrogen gas has been added to the inert-gas-dissolved water prepared by the inert-gas-dissolved water preparing unit 50. In addition, the oxygen concentration of the internal atmosphere of the seal chamber 2 is sufficiently reduced. Thus, the inert-gas-dissolved water having a sufficiently reduced oxygen concentration can be supplied to the front surface of the wafer W. This suppresses or prevents an oxidation reaction which may otherwise occur due to oxygen dissolved in the inert-gas-dissolved water. Therefore, oxide etching can be suppressed, which may otherwise occur due to the diluted hydrofluoric acid solution remaining on the wafer W. Thus, the wafer W is substantially free from undesired etching.

The rinsing process is continued, for example, until the amount of fluoride ions remaining in the internal space of the seal chamber 2 reaches a predetermined low level (e.g., 0.15 ng/cm$^2$ or lower). Whether the amount of fluoride ions remaining in the seal chamber 2 reaches the predetermined low level may be determined based on detection of the amount of fluoride ions remaining in the seal chamber 2 by a fluoride ion sensor (not shown) disposed on the inner surface of the partition wall 9 of the chamber body 6, or based on whether a period of time during which the inert-gas-dissolved water is spouted from the treatment liquid nozzle 4 reaches a predetermined period. After the amount of the fluoride ions remaining in the seal chamber 2 reaches the predetermined low level, the drying process (spin-drying process) is performed for drying the wafer W as shown in FIG. 12E.

The controller 131 controls the chuck lift mechanism 100 to move up the spin chuck 3 to the uppermost spin-drying position (second locating step). Thus, the substrate opposing surface 23 of the lid member 7 is located adjacent the front surface of the wafer W held by the spin chuck 3. The front surface of the wafer W held by the spin chuck 3 located at the spin-drying position is spaced a predetermined small distance (e.g., 0.1 to 5.0 mm, preferably 2.5 mm) from the substrate opposing surface 23 of the lid member 7. Therefore, a minute space is defined between the front surface of the wafer W and the substrate opposing surface 23, and shielded from an atmosphere laterally surrounding the minute space. This makes it possible to properly perform the drying process while precisely controlling the atmosphere adjacent to the front surface of the wafer W, and suppresses adhesion of foreign matter to the front surface of the wafer W during the drying process.

After the spin chuck 3 is moved up to the spin-drying position, the controller 131 accelerates the spin motor 41 to rotate the wafer W held by the spin chuck 3 at a higher rotation speed (e.g., 1000 to 2500 rpm, preferably 2500 rpm). In the drying process, the controller 131 controls the lid member rotation mechanism 32 to rotate the lid member 7 in the same direction as the wafer W in synchronism with the wafer W. This makes it possible to stably generate a pneumatic stream between the front surface of the wafer W and the substrate opposing surface 23 of the lid member 7, while shielding the space defined between the front surface of the wafer W and the substrate opposing surface 23 from the atmosphere laterally surrounding the space.

Since the nitrogen gas is continuously supplied from the inert gas spout 29, a nitrogen gas stream flowing from the center of the wafer W to the peripheral edge of the wafer W is generated between the front surface of the wafer W and the substrate opposing surface 23. Thus, the space defined between the front surface of the wafer W and the substrate opposing surface 23 is filled with the nitrogen gas, whereby the drying process can be performed on the wafer W in a lower oxygen concentration atmosphere.

In the drying process, the wafer W is rotated at a higher rotation speed, and the rinse liquid (inert-gas-dissolved water) adhering to the wafer W receives a centrifugal force generated by the rotation of the wafer W to be spun around the wafer W. Thus, the rinse liquid is removed from the wafer W to dry the wafer W.

An IPA liquid may be supplied to the front surface of the wafer W held by the spin chuck 3 located at the spin-drying position immediately before the drying process. Where the substrate treatment apparatus 1 is adapted to supply the IPA liquid to the upper treatment liquid nozzle 25 as indicated by a two-dot-and-dash line in FIG. 1, the IPA liquid can be supplied to the center of the front surface of the wafer W. Thus, the inert-gas-dissolved water (rinse liquid) can be properly replaced with the IPA liquid, making it possible to advantageously dry the front surface of the wafer W.

After the drying process is performed for a predetermined drying period, the controller 131 controls the spin motor 41 to stop rotating the wafer W. The controller 131 controls the lid member rotation mechanism 32 to stop rotating the lid member 7, and drives the lid member lift mechanism 33 to move up the lid member 7 to the open position (see FIG. 12A) spaced upward from the spin base 43 of the spin chuck 3. Thus, the upper opening 5 of the seal chamber 2 is opened. Further, the controller 131 closes the inert gas valve 30 to stop supplying the nitrogen gas from the inert gas spout 29.

Thereafter, the wafer W is transferred to the substrate transport robot (not shown) from the spin chuck 3 located at the spin-drying position through the upper opening 5 thus opened, and transported out of the seal chamber 2 by the substrate transport robot.

The rinsing process may be performed by using the rinse liquid supplied from the upper treatment liquid nozzle 25 rather than by using the rinse liquid supplied from the treatment liquid nozzle 4. In this case, the carbonated water is spouted toward the upper surface of the wafer W from the upper treatment liquid spout 26 of the upper treatment liquid nozzle 25 with the carbonated water valve 27 being open. The carbonated water supplied to the wafer W receives a centrifugal force generated by the rotation of the wafer W to spread over the entire front surface of the wafer W, whereby the chemical agent adhering to the front surface of the wafer W is rinsed away.

Alternatively, the rinsing process may be performed by using both the rinse liquid supplied from the treatment liquid nozzle 4 and the rinse liquid supplied from the upper treatment liquid nozzle 25.

Next, the chamber cleaning process for cleaning the inside of the seal chamber 2 with the cleaning liquid (e.g., the de-ionized water) will be described. The chamber cleaning process may be performed between substrate treatment process sequences in the substrate treatment apparatus 1. In the chamber cleaning process, the spin chuck 3 is located at the chamber cleaning position with no wafer W held by the spin chuck 3.

The controller 131 controls the chuck lift mechanism 100 to move down the spin chuck 3 to the chamber cleaning position (first locating step). The controller 131 controls the lid member lift mechanism 33 to move down the lid member 7 to the closed position, and controls the lid member rotation mechanism 32 to rotate the lid member 7 at a predetermined rotation speed (lid cleaning rotation speed). Further, the controller 131 opens the cleaning liquid valve 35 to supply the cleaning liquid to the substrate opposing surface 23 of the lid member 7 from the cleaning liquid nozzle 34. In this embodiment, the de-ionized water is used as the cleaning liquid (see FIG. 12F). Even during the rotation of the lid member 7, the inside of the seal chamber 2 can be maintained in the sealed state by the function of the first liquid seal structure 8. Thus, the interior wall of the seal chamber 2 defining the small internal space can be kept clean.

The cleaning liquid supplied to the substrate opposing surface 23 of the lid member 7 receives a centrifugal force generated by the rotation of the lid member 7 to move outward radially of the rotation center over the substrate opposing surface 23 of the lid member 7. Thus, the cleaning liquid evenly spreads over the entire substrate opposing surface 23 of the lid member 7, making it possible to wash away the chemical agent and the rinse liquid containing the chemical agent from the substrate opposing surface 23 of the lid member 7 with the cleaning liquid.

The cleaning liquid moving outward radially of the rotation center over the substrate opposing surface 23 of the lid member 7 is guided to the inner surface of the partition wall 9 of the chamber body 6 by the lower surface 103 (see FIG. 3) and the first conical surface 17 (see FIG. 1) to flow downward on the inner surface of the partition wall 9 of the chamber body 6. At this time, the treatment liquid (the chemical agent and the rinse liquid containing the chemical agent) adhering to the inner surface of the partition wall 9 is washed away with the cleaning liquid. The cleaning liquid thus washing away the treatment liquid flows into the waste gas/liquid channel 20, and guided to the waste liquid treatment facility through the waste gas/liquid channel 20 and the waste gas/liquid passage 110.

The chamber cleaning process is performed with the spin chuck 3 being located at the chamber cleaning position different from the treatment position. At the chamber cleaning position, the spin chuck 3 is closer to the lid member 7 than at the treatment position. The treatment liquid scattering from the wafer W during the liquid treatment process adheres to a region of the inner surface of the partition wall 9 of the chamber body 6 (the interior wall of the seal chamber 2) opposed to the periphery of the wafer W held by the spin chuck 3 located at the treatment position. If the chamber cleaning process is performed with the spin chuck 3 or the seal chamber 2 being located at the treatment position, the treatment liquid (the chemical agent or the rinse liquid containing the chemical agent) scattering around from the periphery of the wafer W and adhering to the inner surface of the partition wall 9 of the chamber body 6 in the chemical agent treatment process or the rinsing process would splash over the spin chuck 3 to contaminate the spin chuck 3. To cope with this, when the seal chamber 2 is cleaned, the spin chuck 3 is located closer to the lid member 7 than at the treatment position. Thus, the inner surface region of the partition wall 9 opposed to the periphery of the wafer W held by the spin chuck 3 located at the treatment position is located at a lower position than the spin chuck 3 located at the chamber cleaning position. Therefore, the treatment liquid removed from the interior wall of the seal chamber 2 during the cleaning of the seal chamber 2 is substantially prevented from splashing over and adhering to the spin chuck 3. The chamber cleaning process may be performed during the wafer cleaning process sequence. The chamber cleaning process is desirably performed after the rinsing process before the drying process. More specifically, the chamber cleaning process is performed after the amount of fluoride ions remaining in the seal chamber 2 reaches the predetermined low level. At this time, the wafer W is held by the spin chuck 3, so that the cleaning liquid is liable to splash over the wafer W in the chamber cleaning process. In this case, it is desired to use the inert-gas-dissolved water as the cleaning liquid so as not to supply oxygen to the wafer W from the cleaning liquid. Where the chamber cleaning process is performed during the wafer cleaning process sequence, it is desired to supply the nitrogen gas from the inert gas spout 29 in the chamber cleaning process. Thus, the inside of the seal chamber 2 can be maintained in the lower oxygen concentration state even during the chamber cleaning process.

In the wafer cleaning process sequence, the flow rate of the nitrogen gas to be supplied to the seal chamber 2 in the chemical agent treatment process may be the same as that in the nitrogen gas purging process, or may be higher than that in the nitrogen gas purging process. The flow rate of the nitrogen gas to be supplied to the seal chamber 2 in the rinsing process may be the same as that in the nitrogen gas purging process, or may be higher than that in the nitrogen gas purging process. Further, the flow rate of the nitrogen gas to be supplied to the seal chamber 2 in the drying process may be the same as that in the nitrogen gas purging process, or may be higher than that in the nitrogen gas purging process.

According to this embodiment, as described above, the internal space of the seal chamber 2 is sealed, and has a smaller volume. Therefore, the atmosphere of the internal space of the seal chamber 2 can be properly controlled. Thus, the internal space can be controlled to be maintained in the lower oxygen concentration atmosphere. This makes it possible to treat the wafer W with the treatment liquid in the atmosphere having a sufficiently reduced oxygen concentration.

The first liquid seal structure 8 seals between the lid member 7 and the chamber body 6. Therefore, the internal space of the seal chamber 2 can be maintained in the sealed state even during the rotation of the lid member 7. The liquid seal structure is substantially free from emission of dust and reduction in sealability as compared with a case in which a contact seal structure is employed. Thus, the seal between the lid member 7 and the chamber body 6 can be properly maintained for a longer period of time.

In this embodiment, the sealed space is thus defined by the chamber body 6, the rotatable lid member 7 and the first liquid seal structure 8 sealing between the chamber body 6 and the lid member 7. The rotatable lid member 7 can also function to shield the space above the front surface of the wafer W from the atmosphere laterally surrounding the space, thereby obviating the need for separately providing a shield member in the sealed space. This makes it possible to reduce the volume of the sealed space, so that the internal atmosphere can be sufficiently controlled. Thus, the internal space of the seal chamber 2 can be controlled to be maintained in a sufficiently low oxygen concentration atmosphere.

The inside of the seal chamber 2 is cleaned with the spin chuck 3 being located at the chamber cleaning position different from the treatment position. At the chamber cleaning position, the spin chuck 3 is closer to the lid member 7 than at the treatment position. The treatment liquid (the chemical agent or the rinse liquid containing the chemical agent) scattering around from the wafer W during the chemical agent treatment process or the rinsing process adheres to the interior wall region of the seal chamber 2 opposed to the periphery of the wafer W held by the spin chuck 3 located at the treatment position. When the inside of the seal chamber 2 is cleaned, therefore, the spin chuck 3 is located closer to the lid member 7 than at the treatment position. Thus, the interior wall region opposed to the periphery of the wafer W held by the spin chuck 3 located at the treatment position, for example, is located at a lower position than the spin chuck 3 located at the chamber cleaning position. Therefore, the treatment liquid removed from the interior wall of the seal chamber 2 during the cleaning of the interior wall of the seal chamber 2 is substantially prevented from splashing over and adhering to the spin chuck 3. This suppresses the contamination of the spin chuck 3 and hence the contamination of the wafer W held by the spin chuck 3.

Further, the nozzle arm 15 supporting the treatment liquid nozzle 4 extends through the passage hole 14 of the partition wall 9 from the inside to the outside of the seal chamber 2. The linear driving mechanism 36 for driving the nozzle arm 15 is disposed outside the seal chamber 2. The linear driving mechanism 36 inputs its driving force to a part of the nozzle arm 15 exposed from the seal chamber 2 to move the nozzle arm 15. Thus, the treatment liquid nozzle 4 can be moved in the seal chamber 2 by the driving force applied from the linear driving mechanism 36 disposed outside the seal chamber 2. Since the linear driving mechanism 36 is disposed outside the seal chamber 2, the volume of the internal space of the seal chamber 2 can be reduced.

The internal space of the seal chamber 2 is sealed, and has a reduced volume. Therefore, the atmosphere of the internal space of the seal chamber 2 can be properly controlled. This makes it possible to treat the wafer W with the treatment liquid in the atmosphere having a sufficiently reduced oxygen concentration.

Next, the results of measurement obtained when the wafer W was treated by the substrate treatment apparatus 1 will be described.

Figure 13:
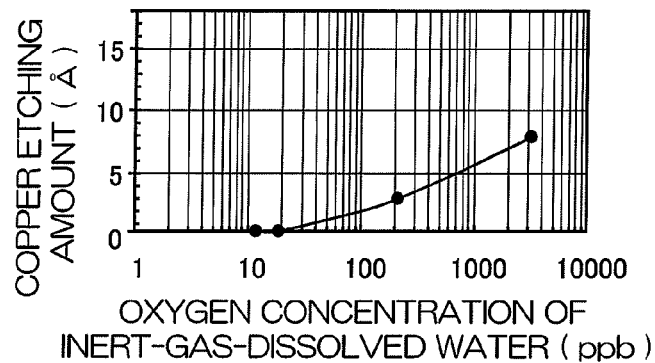
FIG. 13 is a diagram showing a relationship between the oxygen concentration of inert-gas-dissolved water and the copper etching amount.

FIG. 13 is a diagram showing a relationship between the oxygen concentration of the inert-gas-dissolved water and the copper etching amount. The chemical agent treatment (polymer removing process) was performed to treat the front surface of the wafer W with the diluted hydrofluoric acid solution, and the copper etching amount (reduction in film thickness) was measured. The results of the measurement are shown in FIG. 13. The diluted hydrofluoric acid solution was prepared by mixing hydrofluoric acid and de-ionized water in a ratio of 1:100. Further, hydrofluoric acid to be contained in the diluted hydrofluoric acid solution was not preliminarily degassed for removal of oxygen. Since the proportion of hydrofluoric acid in the diluted hydrofluoric acid solution used in this measurement was very small relative to the de-ionized water, the oxygen concentration of the diluted hydrofluoric acid solution was regarded to be nearly equal to the oxygen concentration of the inert-gas-dissolved water used for the preparation of the diluted hydrofluoric acid solution. A period for the chemical agent treatment was 60 seconds.

In FIG. 13, the leftmost measurement value (the value of the leftmost point ●) was a copper etching amount observed when the chemical agent treatment was performed with the use of a diluted hydrofluoric acid solution prepared by employing inert-gas-dissolved water having an oxygen concentration of 12 ppb. Further, the second measurement value from the left (the value of the second point ● from the left) was a copper etching amount observed when the chemical agent treatment was performed with the use of a diluted hydrofluoric acid solution prepared by employing inert-gas-dissolved water having an oxygen concentration of 20 ppb. As can be understood from the measurement results shown in FIG. 13, the chemical agent treatment performed with the use of a diluted hydrofluoric acid solution prepared by employing inert-gas-dissolved water having an oxygen concentration of 20 ppb or lower reliably suppresses or prevents the etching of copper. That is, the diluted hydrofluoric acid solution prepared by employing inert-gas-dissolved water having an oxygen concentration of 20 ppb or lower reliably suppresses or prevents generation of copper oxide.

Figure 14:
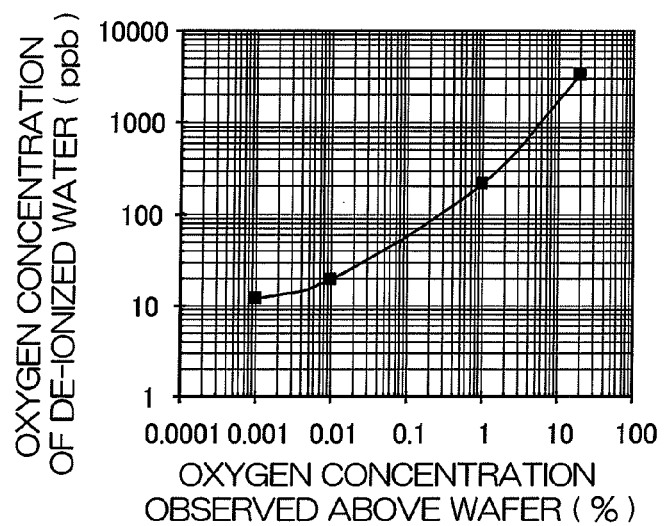
FIG. 14 is a diagram showing a relationship between the oxygen concentration observed above the wafer and the oxygen concentration of de-ionized water supplied to an upper surface of the wafer.

FIG. 14 is a diagram showing a relationship between the oxygen concentration observed above the wafer W and the oxygen concentration of the de-ionized water supplied to the front surface of the wafer W. The inert-gas-dissolved water was supplied from the treatment liquid nozzle 4 toward the front surface of the wafer W held by the spin chuck 3 located at the treatment position, and the oxygen concentration of the inert-gas-dissolved water supplied to the front surface of the wafer W was measured. The results of the measurement are shown in FIG. 14. The inert-gas-dissolved water spouted from the treatment liquid nozzle 4 had an oxygen concentration of 10 ppb.

In FIG. 14, the leftmost measurement value (the value of the leftmost point ■) was the oxygen concentration of the inert-gas-dissolved water supplied to the front surface of the wafer W when the oxygen concentration observed above the wafer W was 0.001% (10 ppm). The oxygen concentration of the inert-gas-dissolved water observed at this time was 12 ppb. Further, the second measurement value from the left (the value of the second point ■ from the left) was the oxygen concentration of the inert-gas-dissolved water supplied to the front surface of the wafer W when the oxygen concentration observed above the wafer W was 0.01% (100 ppm). The oxygen concentration of the inert-gas-dissolved water observed at this time was 20 ppb.

As can be understood from the measurement results shown in FIG. 14, the oxygen concentration of the de-ionized water supplied to the front surface of the wafer W can be maintained at 20 ppb or lower, if the oxygen concentration observed above the wafer W is 100 ppm or lower when the de-ionized water having an oxygen concentration of 10 ppb is supplied toward the front surface of the wafer W. The measurement results shown in FIGS. 13 and 14 indicate that the oxygen concentration of the diluted hydrofluoric acid solution to be supplied to the front surface of the wafer W can be maintained at not higher than 20 ppb by spouting a diluted hydrofluoric acid solution having an oxygen concentration of 10 ppb or lower toward the front surface of the wafer W while maintaining the oxygen concentration observed above the wafer W at 100 ppm or lower. Thus, the oxidation of copper by oxygen dissolved in the diluted hydrofluoric acid solution can be reliably suppressed or prevented.

Figure 15:
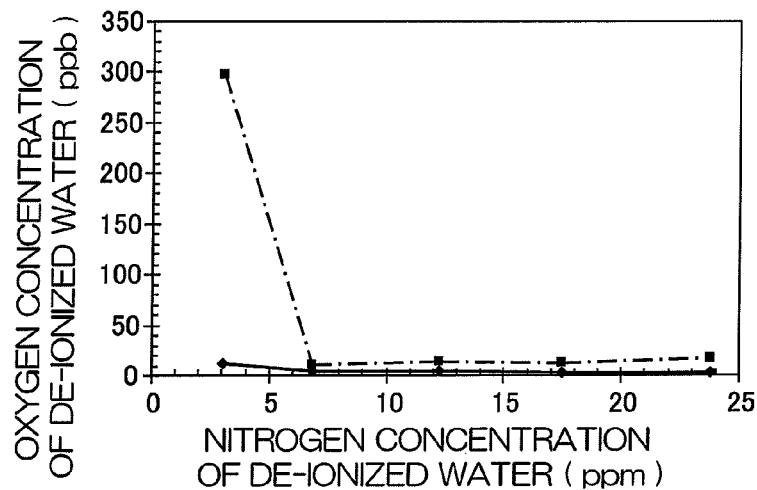
FIG. 15 is a diagram showing a relationship between the oxygen concentration of de-ionized water and the nitrogen concentration of the de-ionized water.

FIG. 15 is a diagram showing a relationship between the oxygen concentration of the de-ionized water and the nitrogen concentration of the de-ionized water. In FIG. 15, values plotted by a one-dot-and-dash line are oxygen concentration levels measured immediately after the de-ionized water was degassed for removal of oxygen, and values plotted by a solid line are oxygen concentration levels measured after the de-ionized water degassed to the oxygen concentration levels plotted by the one-dot-and-dash line was exposed to the ambient atmosphere for 10 second or longer. Where the nitrogen gas was not added to the de-ionized water, the de-ionized water had a nitrogen concentration of 3 ppm.

The measurement results shown in FIG. 15 indicate that, if the de-ionized water has a nitrogen concentration of lower than 7 ppm, the oxygen concentration of the de-ionized water increases over time. Therefore, the increase in the oxygen concentration of the de-ionized water over time can be suppressed or prevented by adding the nitrogen gas to the de-ionized water to maintain the nitrogen concentration of the de-ionized water at 7 ppm or higher. Thus, the oxygen concentration of the de-ionized water degassed for the removal of oxygen can be maintained at a lower level.

Figure 16:
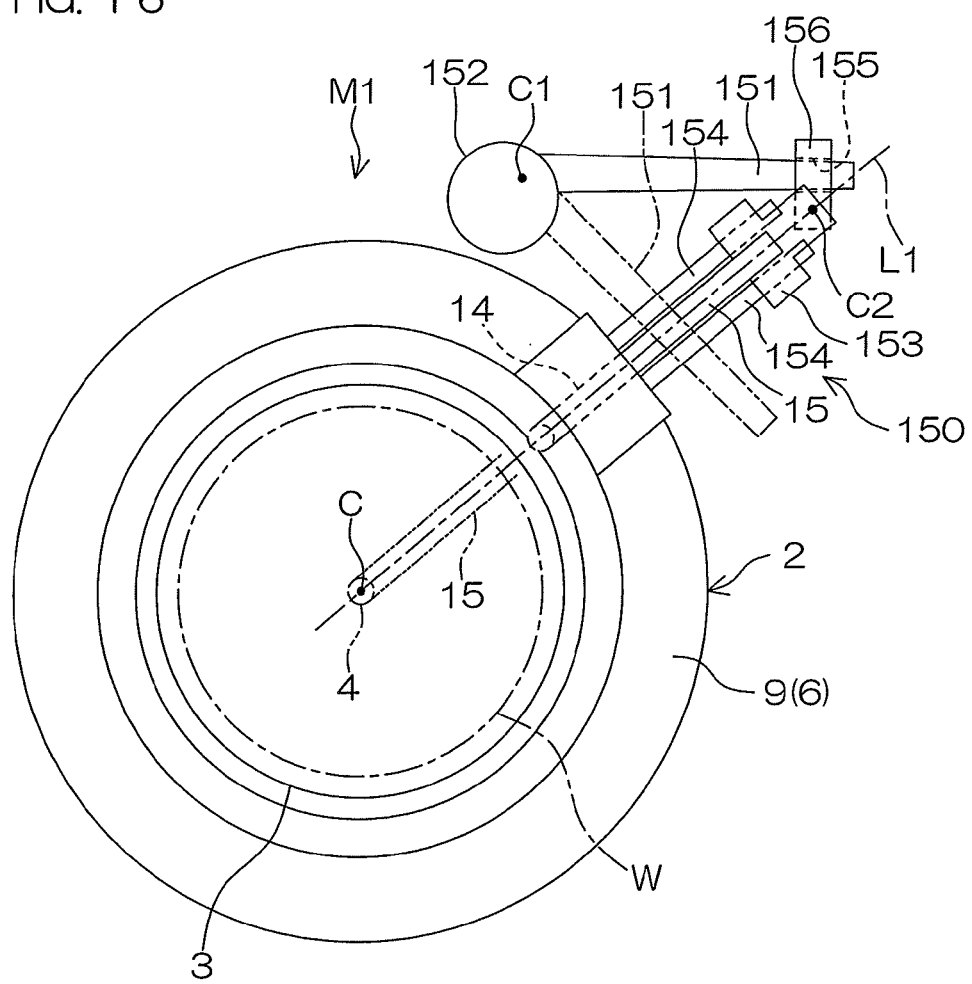
FIG. 16 is a schematic plan view for explaining the construction of a substrate treatment apparatus according to another embodiment of the present invention.

FIG. 16 is a schematic plan view for explaining the construction of a substrate treatment apparatus according to another embodiment of the present invention. In the embodiment shown in FIG. 16, components corresponding to those described in the first embodiment shown in FIGS. 1 to 15 will be denoted by the same reference characters as in the first embodiment, and duplicate description will be omitted. A major difference between the embodiment shown in FIG. 16 and the embodiment shown in FIGS. 1 to 15 is that a linear driving mechanism (linear driving unit) 150 is used instead of the linear driving mechanism 36 as a drive mechanism for driving the treatment liquid nozzle 4.

The linear driving mechanism 150 includes a drive arm 151 connected to the nozzle arm 15 at a variable connection position, and a motor 152 (pivot driving unit) which pivots the drive arm 151 about a predetermined vertical axis (pivot axis) C1.

A connection member 153 is connected to the proximal end portion of the nozzle arm 15. The connection member 153 is guided by two guide shafts 154 for movement thereof along the reference line L1. A pivot piece 156 having a horizontal insertion hole 155 is supported rotatably about a predetermined vertical axis C2 by the connection member 153. The drive arm 151 is retractably inserted in the insertion hole 155, and the pivot piece 156 is longitudinally movable with respect to the nozzle arm 15. The rotative driving force of the motor 152 is inputted to the drive arm 151, whereby the drive arm 151 is pivoted about the vertical axis C1 within a predetermined range. The connection member 153 is guided by the guide shafts 154. Therefore, the pivot piece 156 is relatively moved longitudinally of the drive arm 151 and pivoted about the vertical axis C2 to change its attitude according to a change in the angle (pivot angle) of the drive arm 151, whereby the connection member 153 is moved along the reference line L1 to linearly move the nozzle arm 15 along the reference line L1. According to the pivoting of the drive arm 151, a distance between the pivot piece 156 and a proximal end of the drive arm 151, i.e., a distance between the vertical axis C1 and the vertical axis C2, is changed.

Thus, the nozzle arm 15 is linearly moved (moved back and forth) along the reference line L1 according to the pivoting of the drive arm 151, and the treatment liquid nozzle 4 is moved between a retracted position located on a lateral side of the wafer W held by the spin chuck 3 (as indicated by a broken line in FIG. 16) and a position located above the front surface of the wafer W held by the spin chuck 3 (as indicated by a two-dot-and-dash line in FIG. 16) by the movement of the nozzle arm 15. Thus, a treatment liquid spouting position at which the treatment liquid is spouted from the treatment liquid nozzle 4 can be moved over the front surface of the wafer W.

Figure 17:
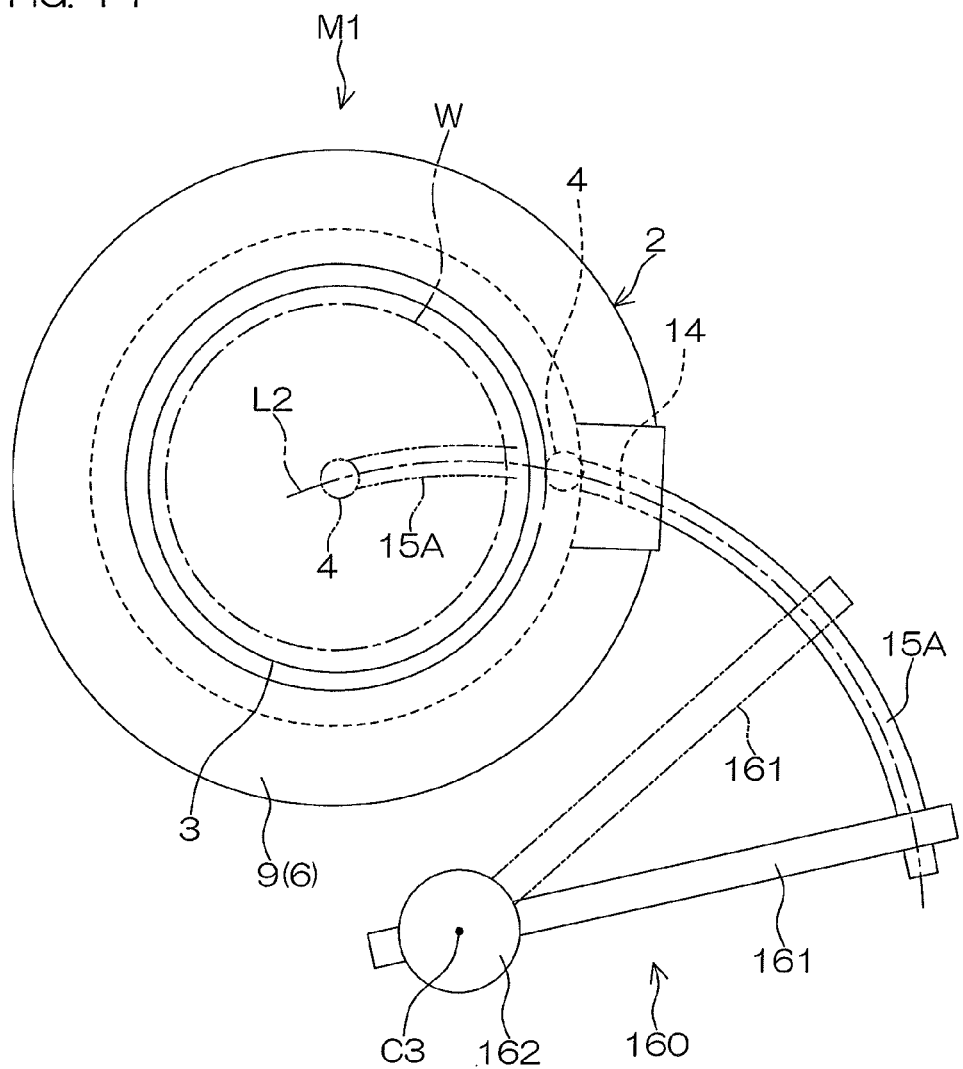
FIG. 17 is a schematic plan view for explaining the construction of a substrate treatment apparatus according to further another embodiment of the present invention.

FIG. 17 is a schematic plan view for explaining the construction of a substrate treatment apparatus according to further another embodiment of the present invention. In the embodiment shown in FIG. 17, components corresponding to those described in the first embodiment shown in FIGS. 1 to 15 will be denoted by the same reference characters as in the first embodiment, and duplicate description will be omitted. A major difference between the embodiment shown in FIG. 17 and the embodiment shown in FIGS. 1 to 15 is that an arcuate driving mechanism (arcuate driving unit) 160 is used instead of the linear driving mechanism 36.

A reference line L2 to be employed in this embodiment is not linear but arcuate, and is defined about a predetermined vertical axis C3. The reference line L2 passes above the rotation axis C. In this embodiment, therefore, an arcuate nozzle arm 15A having a center aligning with the vertical axis C3 is used as the nozzle arm. Further, the inner peripheral surfaces of the passage hole 14 and the first and second insertion holes 123, 113 (not shown in FIG. 17) are not flat but curved (arcuate).

The arcuate driving mechanism 160 includes a drive arm 161 connected to a proximal end portion of the nozzle arm 15A, and a motor 162 (pivot driving unit) which pivots the drive arm 161 about the predetermined vertical axis C3. The rotative driving force of the motor 162 is inputted to the drive arm 161, whereby the drive arm 161 is pivoted about the vertical axis C3 to move the nozzle arm 15A along the reference line L2. Thus, the treatment liquid nozzle 4 can be moved between a retracted position located on a lateral side of the wafer W held by the spin chuck 3 (as indicated by a broken line in FIG. 17) and a position located above the front surface of the wafer W held by the spin chuck 3 (as indicated by a two-dot-and-dash line in FIG. 17). Thus, a treatment liquid spouting position at which the treatment liquid is spouted from the treatment liquid nozzle 4 can be moved over the front surface of the wafer W.

While the three embodiments of the present invention have thus been described, the invention may be embodied in other ways.

When the wafer W is to be loaded onto or unloaded from the spin chuck 3, the spin chuck 3 may be located at a loading/unloading position (at which the spin chuck 3 is located adjacent the lid member 7) spaced upward from the spin-drying position rather than at the spin-drying position.

The substrate treatment apparatus may be adapted to move up and down the seal chamber 2 rather than the spin chuck 3. Further, the substrate treatment apparatus may be adapted to move up and down both the spin chuck 3 and the seal chamber 2. In these cases, a lift mechanism for moving up and down the seal chamber 2 is connected, for example, to the camber body 6. When the seal chamber 2 is moved up and down, the driving mechanism including the nozzle arm 15, the nozzle driving motor 139 and the like should also be moved up and down in synchronism with the seal chamber (i.e., the chamber body 6 and the lid member 7).

Further, the nozzle arm 15 may have a round cross section rather than the rectangular cross section.

Where the internal volume of the seal chamber 2 can be reduced by giving consideration to the shape of the seal chamber 2 even with the provision of the nozzle arm driving mechanism in the seal chamber 2, the linear driving mechanism 36, the linear driving mechanism 150 or the arcuate driving mechanism 160 may be accommodated in the seal chamber 2.

Further, the spin chuck 3 may be unable to move up and down the spin chuck 3 relative to the chamber body 6 (seal chamber 2). In this case, the chuck lift mechanism 100 is unnecessary.

A stationary treatment liquid nozzle having a spout directed toward the front surface (e.g., the front surface center portion) of the wafer W above the spin chuck 3 may be used instead of the movable treatment liquid nozzle 4. In this case, the linear driving mechanism 36, the linear driving mechanism 150 and the arcuate driving mechanism 160 are unnecessary.

The lid member 7 may be unable to rotate relative to the chamber body 6. In this case, the lid member rotation mechanism 32 is unnecessary.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2010-82247 and 2010-82248 filed in the Japanese Patent Office on Mar. 31, 2010, the disclosure of which is incorporated herein by reference in its entirety.

What is claimed is:

1. A substrate treatment method comprising:
a step of preparing a seal chamber defining a sealed internal space, the seal chamber preparing step including a step of closing an opening of a chamber body with a lid member rotatable with respect to the chamber body, and a step of liquid sealing between the lid member and the chamber body with a first liquid seal structure, so as to define the sealed internal space sealed from outside;
a step of placing a substrate in the sealed internal space of the seal chamber and rotating the substrate in the sealed internal space;
a step of supplying a treatment liquid to the substrate in the sealed internal space of the seal chamber, the treatment liquid supplying step being performed while the substrate is rotated in the substrate rotating step;

a first locating step of locating the substrate and the lid member in a drying positional relationship in which the substrate is located closer to the lid member than in the treatment liquid supplying step within the sealed internal space of the seal chamber sealed with the lid member and the first liquid seal structure; and a drying step of rotating the lid member and the substrate at a predetermined drying rotation speed with the substrate and the lid member being located in the drying positional relationship within the sealed internal space of the seal chamber sealed with the lid member and the first liquid seal structure.

2. The substrate treatment method according to claim 1, further comprising:

a second locating step of locating the substrate and the lid member in a lid cleaning positional relationship in which the substrate is located closer to the lid member than in the treatment liquid supplying step within the sealed internal space of the seal chamber sealed with the lid member and the first liquid seal structure; and a lid member cleaning step of rotating the lid member at a predetermined lid cleaning rotation speed and spouting a cleaning liquid toward the lid member from a cleaning liquid spouting unit with the substrate and the lid member being located in the lid cleaning positional relationship within the sealed internal space of the seal chamber sealed with the lid member and the first liquid seal structure.

3. The substrate treatment method according to claim 2, wherein the drying positional relationship is defined such that the substrate is located closer to the lid member than in the lid member cleaning step.

* * * * *